US006652922B1

(12) United States Patent
Forester et al.

(10) Patent No.: US 6,652,922 B1
(45) Date of Patent: Nov. 25, 2003

(54) ELECTRON-BEAM PROCESSED FILMS FOR MICROELECTRONICS STRUCTURES

(75) Inventors: Lynn Forester, San Jose, CA (US); Neil H. Hendricks, Sonora, CA (US); Dong-Kyu Choi, Campbell, CA (US)

(73) Assignee: Alliedsignal Inc., Morristown, NJ (US)

( * ) Notice: Subject to any disclaimer, the term of this patent is extended or adjusted under 35 U.S.C. 154(b) by 1158 days.

(21) Appl. No.: 08/652,893

(22) Filed: May 23, 1996

Related U.S. Application Data

(60) Provisional application No. 60/000,239, filed on Jun. 15, 1995.

(51) Int. Cl.[7] .............................. B05D 3/06; C23C 16/00
(52) U.S. Cl. ....................... 427/551; 427/585; 427/596; 427/314; 427/387; 427/569; 427/255.28
(58) Field of Search ................................ 427/551, 585, 427/595, 314, 387, 581, 596, 553, 255, 255.18, 569

(56) References Cited

U.S. PATENT DOCUMENTS

| | | | | |
|---|---|---|---|---|
| 3,877,980 A | * | 4/1975 | Martin et al. .................. 357/7 |
| 4,222,792 A | | 9/1980 | Lever et al. .................. 148/1.5 |
| 4,560,641 A | * | 12/1985 | Kokaku et al. ............. 430/312 |
| 4,566,937 A | * | 1/1986 | Pitts .......................... 156/628 |
| 4,596,720 A | | 6/1986 | Keryk et al. ................ 427/54.1 |
| 4,666,735 A | * | 5/1987 | Hoover et al. ............. 427/43.1 |
| 4,713,258 A | * | 12/1987 | Umemura .................... 427/35 |
| 4,907,053 A | * | 3/1990 | Ohmi ........................ 357/23.1 |
| 4,921,882 A | * | 5/1990 | Senich ........................ 522/99 |
| 4,942,058 A | * | 7/1990 | Sano .......................... 427/431 |
| 4,961,886 A | * | 10/1990 | Eckstein et al. .............. 264/22 |
| 4,983,540 A | * | 1/1991 | Yamaguchi et al. ........ 437/110 |
| 5,003,178 A | * | 3/1991 | Livesay .................... 250/492.3 |
| 5,045,360 A | * | 9/1991 | Kosal et al. ................. 427/387 |
| 5,130,261 A | * | 7/1992 | Usuki et al. ................... 437/20 |
| 5,364,818 A | * | 11/1994 | Ouellet ....................... 437/195 |
| 5,372,849 A | * | 12/1994 | McCormick et al. ....... 427/253 |
| 5,506,008 A | * | 4/1996 | Klumpp et al. ............. 427/515 |
| 5,550,405 A | * | 8/1996 | Cheung et al. ............. 257/642 |

FOREIGN PATENT DOCUMENTS

| | | |
|---|---|---|
| EP | 0334051 | 9/1989 |
| EP | 0647965 | 4/1995 |
| JP | 60-43814 A * | 3/1985 |
| JP | 58-151517 * | 7/1985 |

OTHER PUBLICATIONS

"Spin/Bake/Cure Procedure for Spin–On Glass Materials for Interlevel Dielectric Planarization", AlliedSignal Inc. (1994).

Kern, "Deposited Dielectrics for VLSI", 8 (7) Semiconductor International 122 (Jul. 1995).

Gurczyca et al., "Plasma–Enhanced Chemical Deposition of Dielectric", 8 (4), VSLI Electronics Microstructure Science (New York 1984).

Mattson, "CVD Films for Interlayer Dielectrics", Solid State Technology 60 (Jan. 1980).

(List continued on next page.)

*Primary Examiner*—Michael Barr
(74) *Attorney, Agent, or Firm*—Roberts & Mercanti, LLP

(57) ABSTRACT

An improved method for producing substrates coated with dielectric films for use in microelectronic applications wherein the films are processed by exposing the coated substrate surfaces to a flux of electron beam. Substrates cured via electron beam exposure possess superior dielectric properties, density, uniformity, thermal stability, and oxygen stability.

16 Claims, 18 Drawing Sheets

OTHER PUBLICATIONS

Takeishi et al., "Stabilizing Dielectric Constants of Fluorine–Doped–SiO2 Films by N20 Plasma Annealing", DUMIC Conference, pp. 257–259 (Feb. 1995).

Loh et al., "Modeling and Measurement of Contact Resistances", IEEE Transactions Electron Devices, pp. 512–524 (Mar. 1987).

Andoh et al., "Design Methodology for Low Voltage MOFSETs", International Electron Device Meeting (IEDM) (Dec. 1994), pp. 94–79–94–82.

Chen et al., Tech. Digest, IEDM, pp 484–487 (1986).

Rountree, Tech. Digest IEDM, pp. 580–583 (1988).

Shimizu et al., "0.15μ CMOS Process for High Performance and High Reliability" IEDM, pp. 94–67–94–70 (Dec. 1994).

Wang et al., "A Study of Plasma Treatments on Siloxane SOB", VMIC Conference, pp. 101–107 (Jun. 1994).

Kojima et al., "Planarization Process Using a Multi–Coating of Spin–On–Glass", VMIC, pp. 390–396 (Jun. 1988).

Electron Vision Technical Bulletin, "Electron Beam Processing of AlliedSignal Accuglass 211 SOG" (Jun. 1994).

Forester et al., Electron Beam Curing of Non–Etchback SOG and Application to a 0.5μm CMOS SRAM Process, VMIC Conference pp. 83–89 (Jun. 27, 1995).

\* cited by examiner

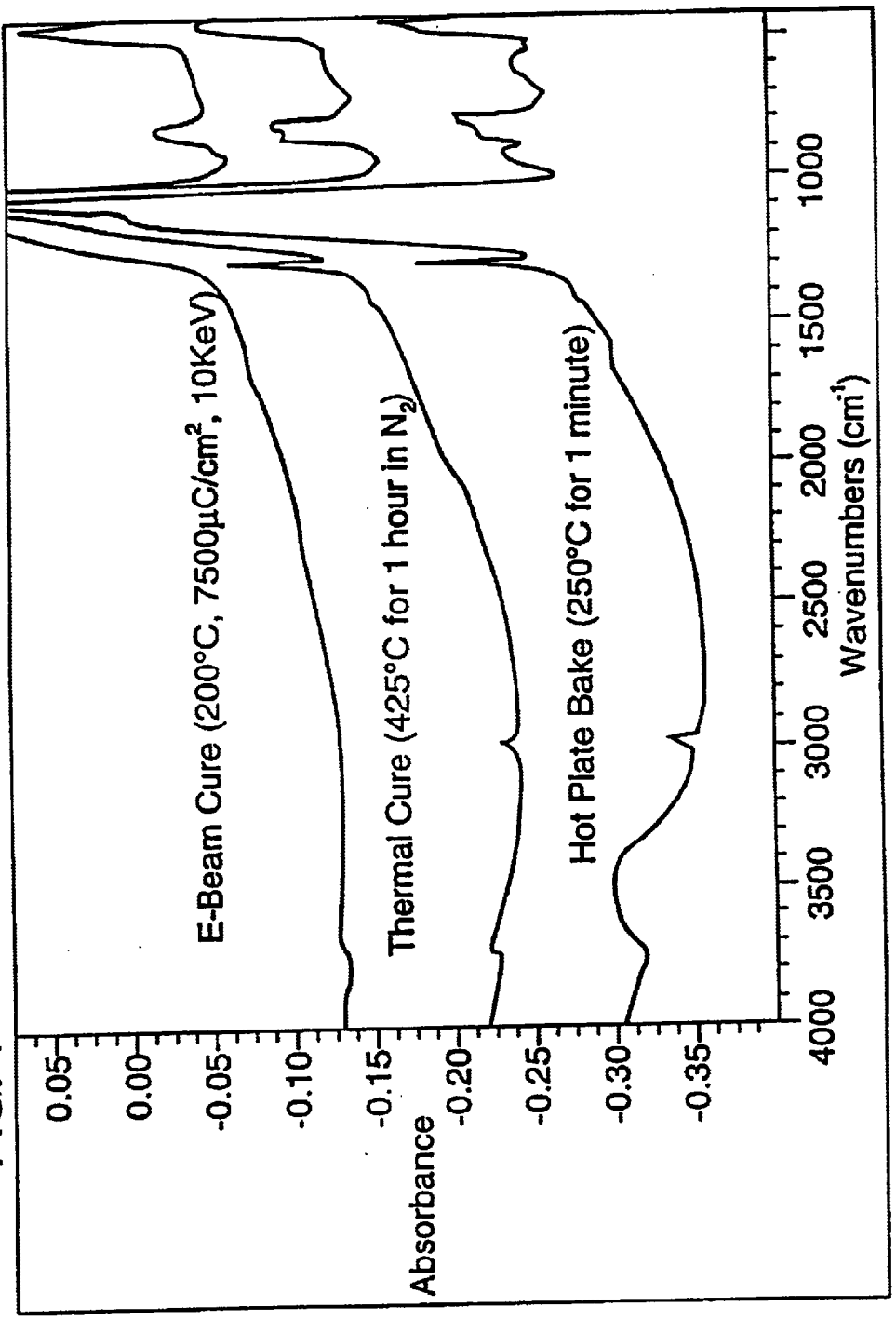
FIG. 1  FTIR SPECTRA OF SILOXANE SOG COATED WAFERS

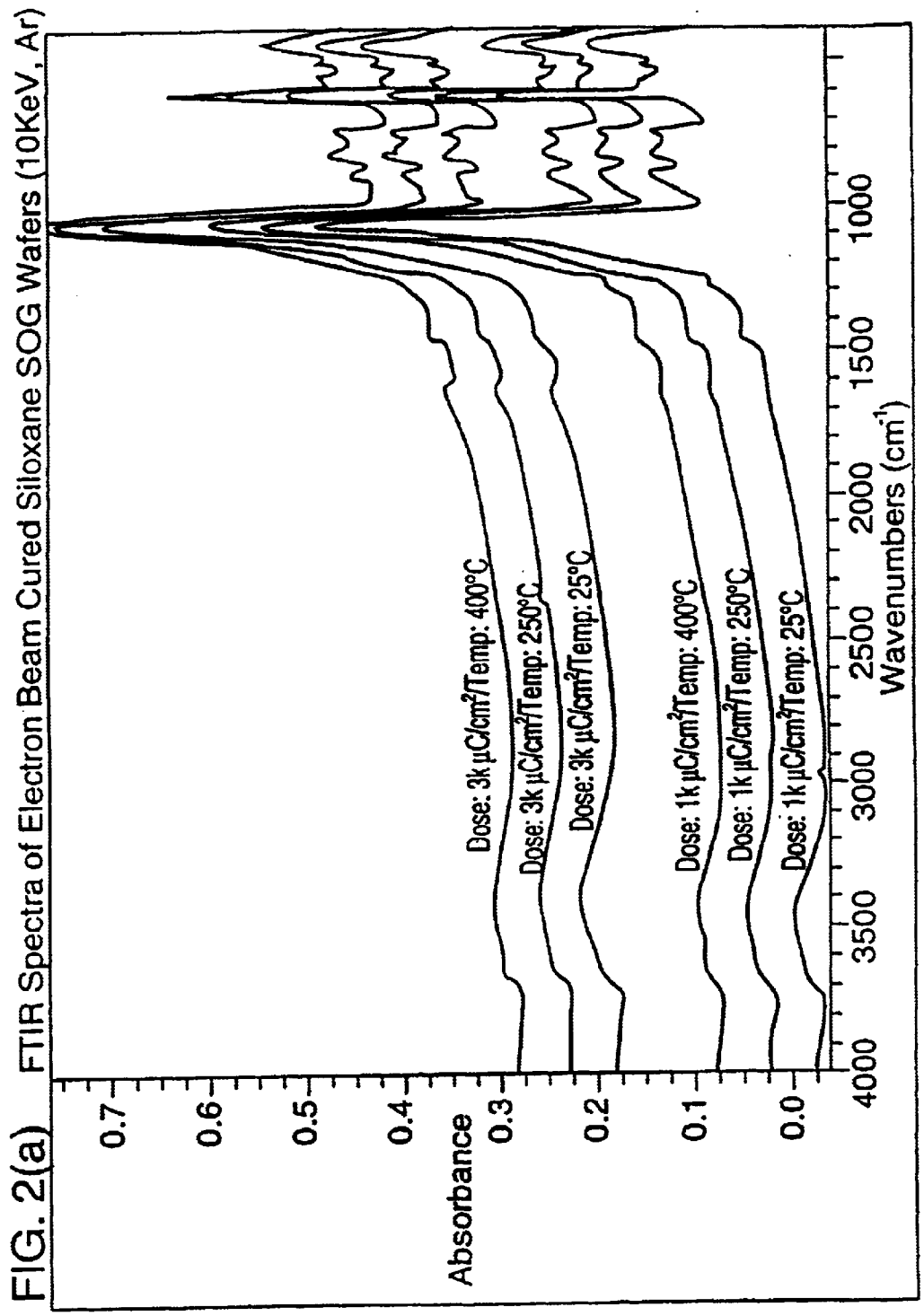
FIG. 2(a) FTIR Spectra of Electron Beam Cured Siloxane SOG Wafers (10KeV, Ar)

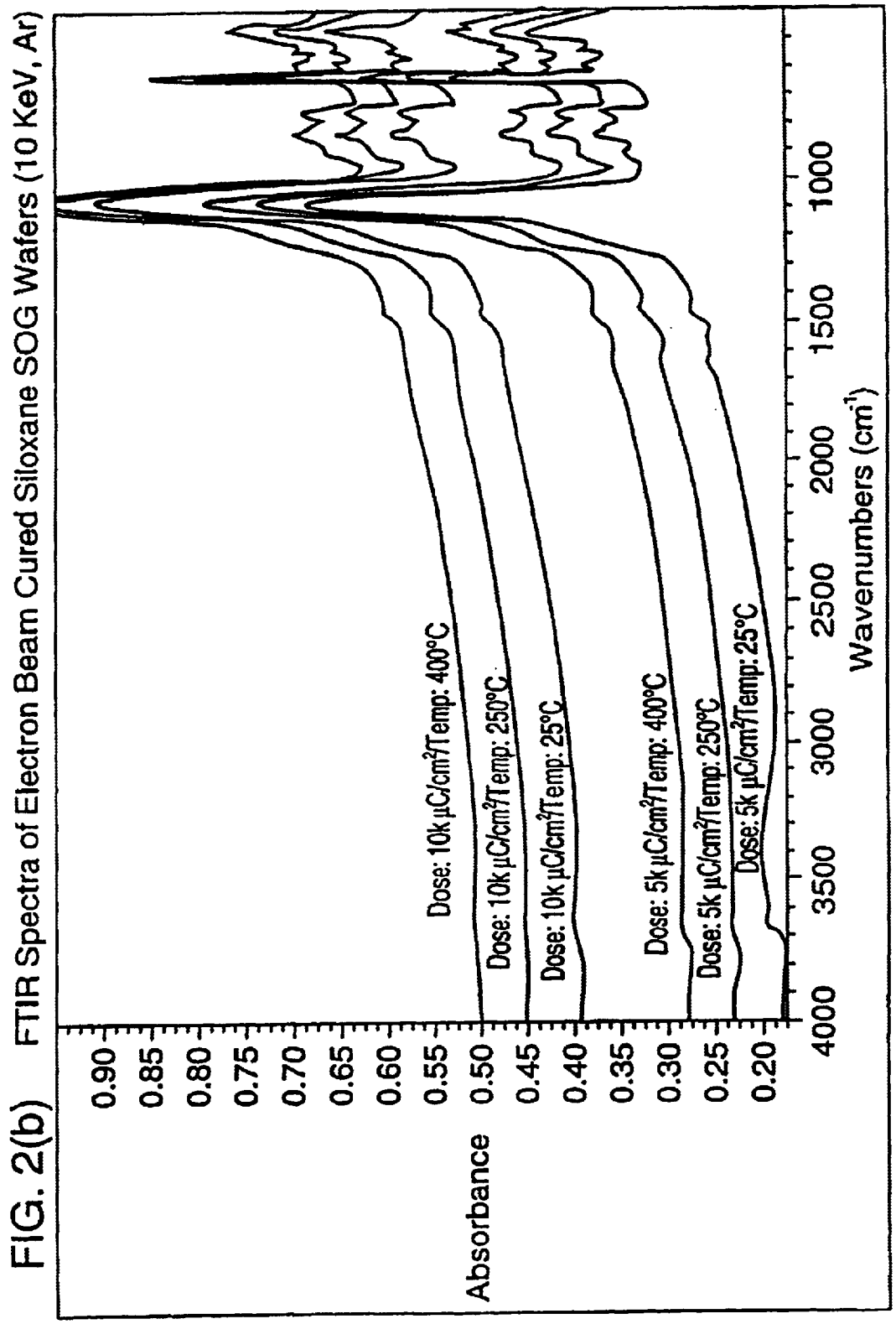
FIG. 2(b) FTIR Spectra of Electron Beam Cured Siloxane SOG Wafers (10 KeV, Ar)

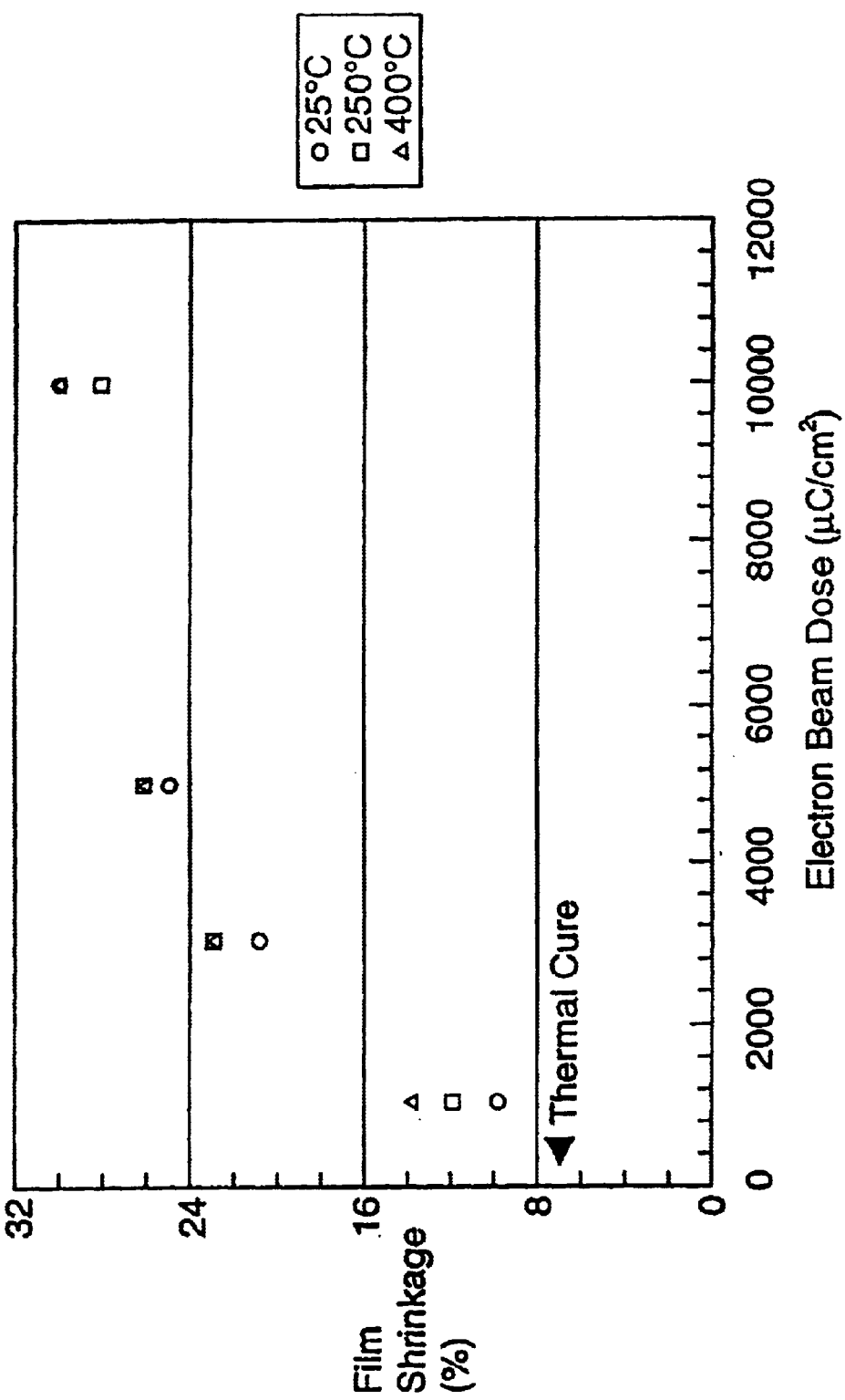

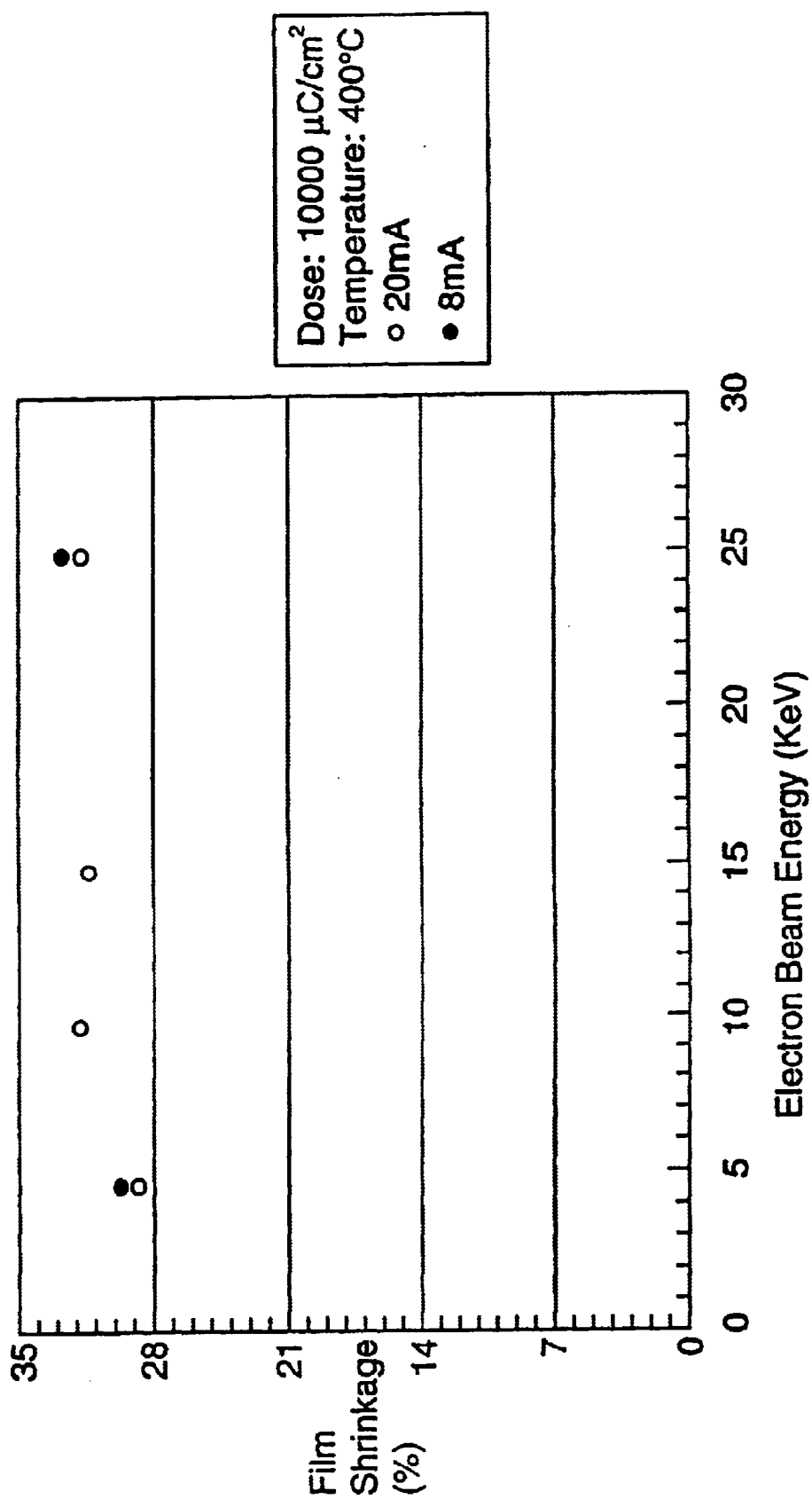
FIG. 4 Film Shrinkage versus Electron Beam Energy

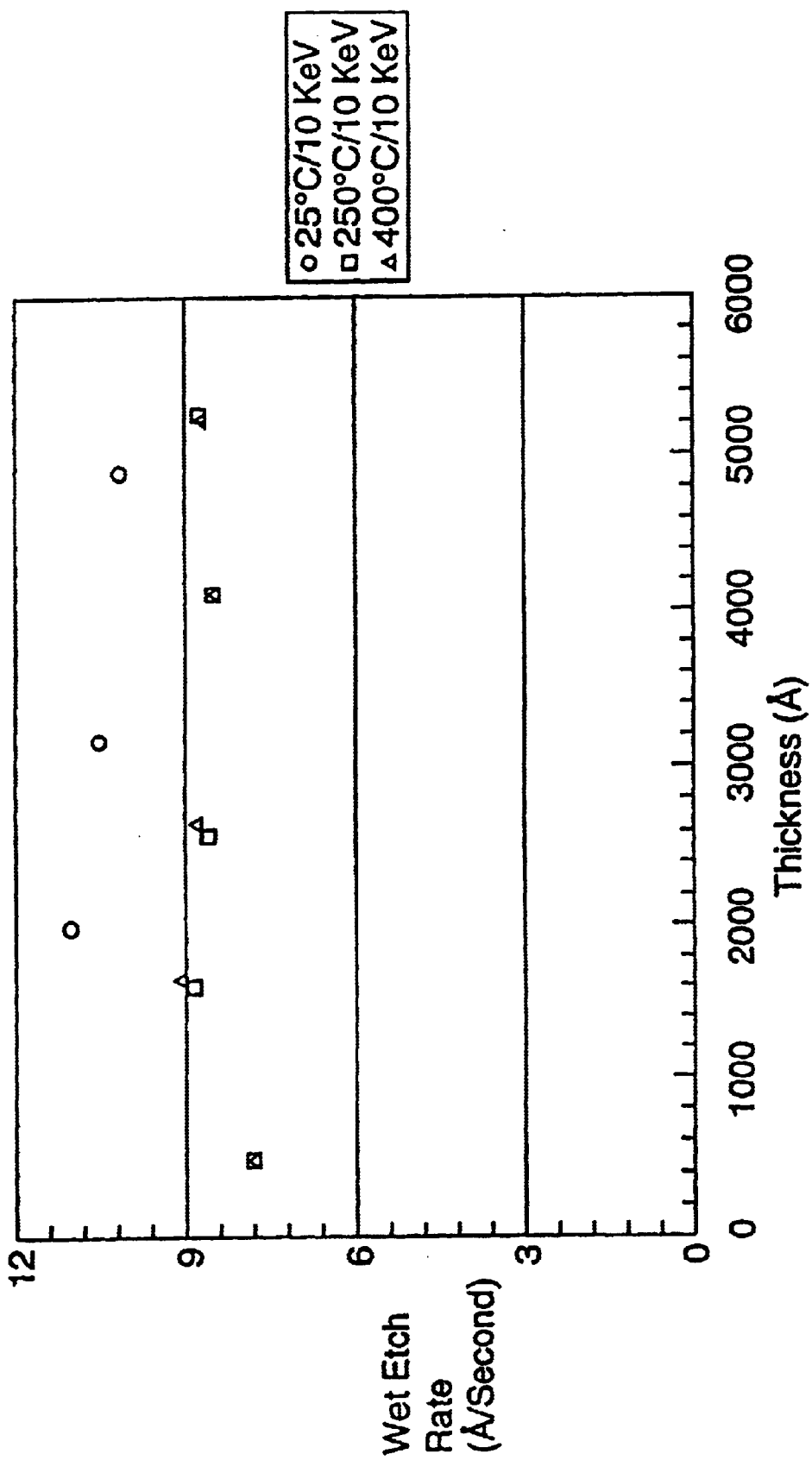

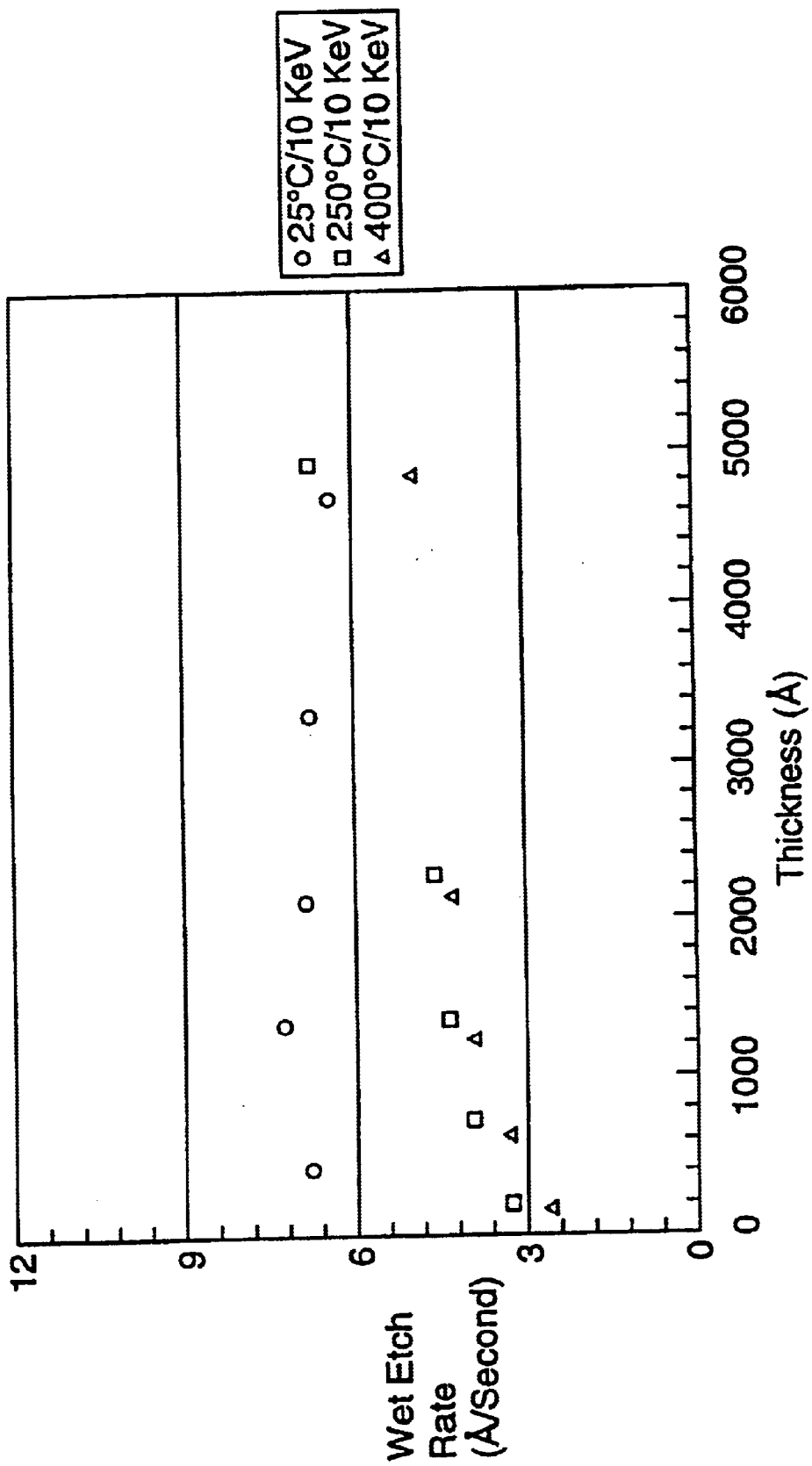
FIG. 6(b) Wet Etch Rate at Dose of 3000 µC/cm²

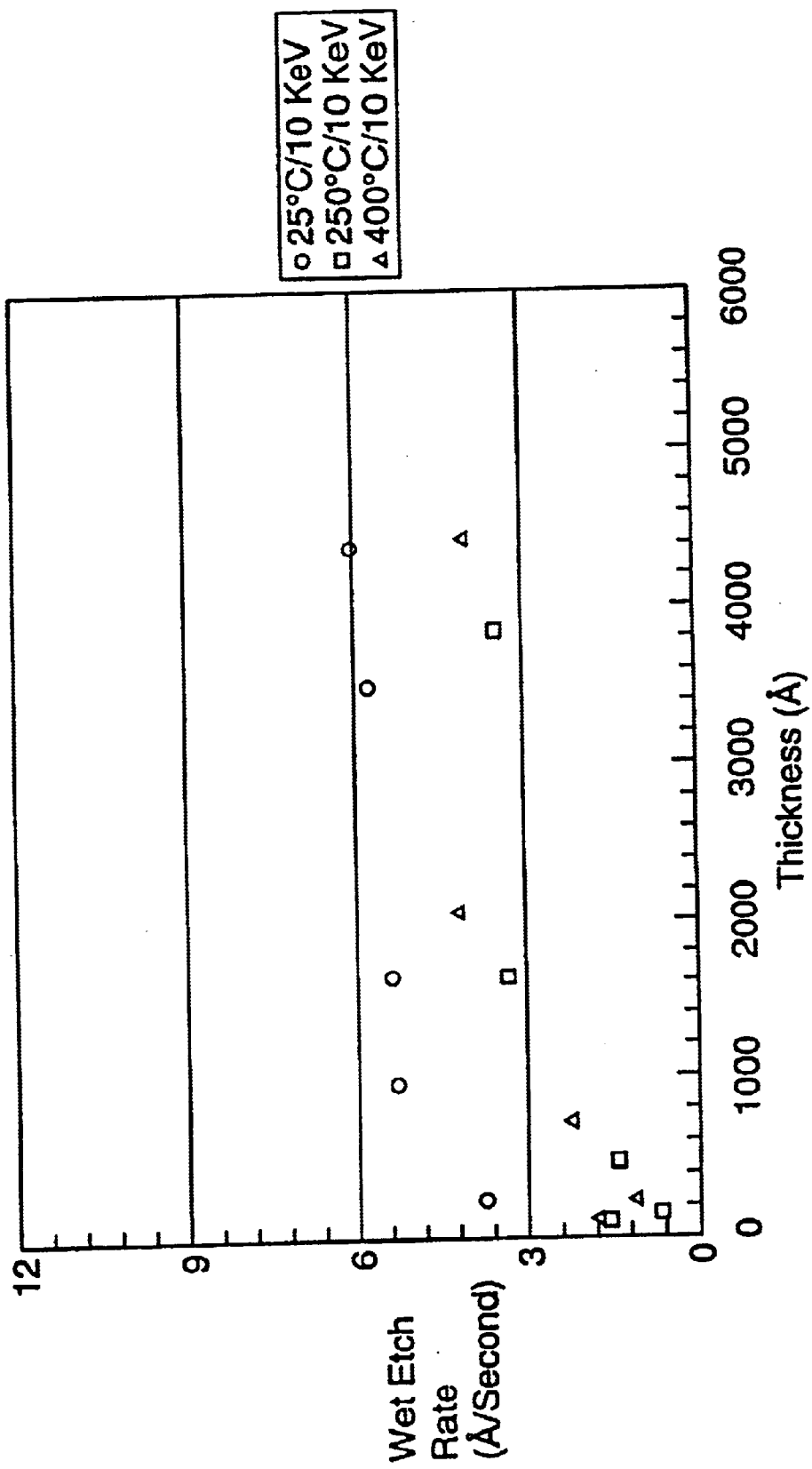

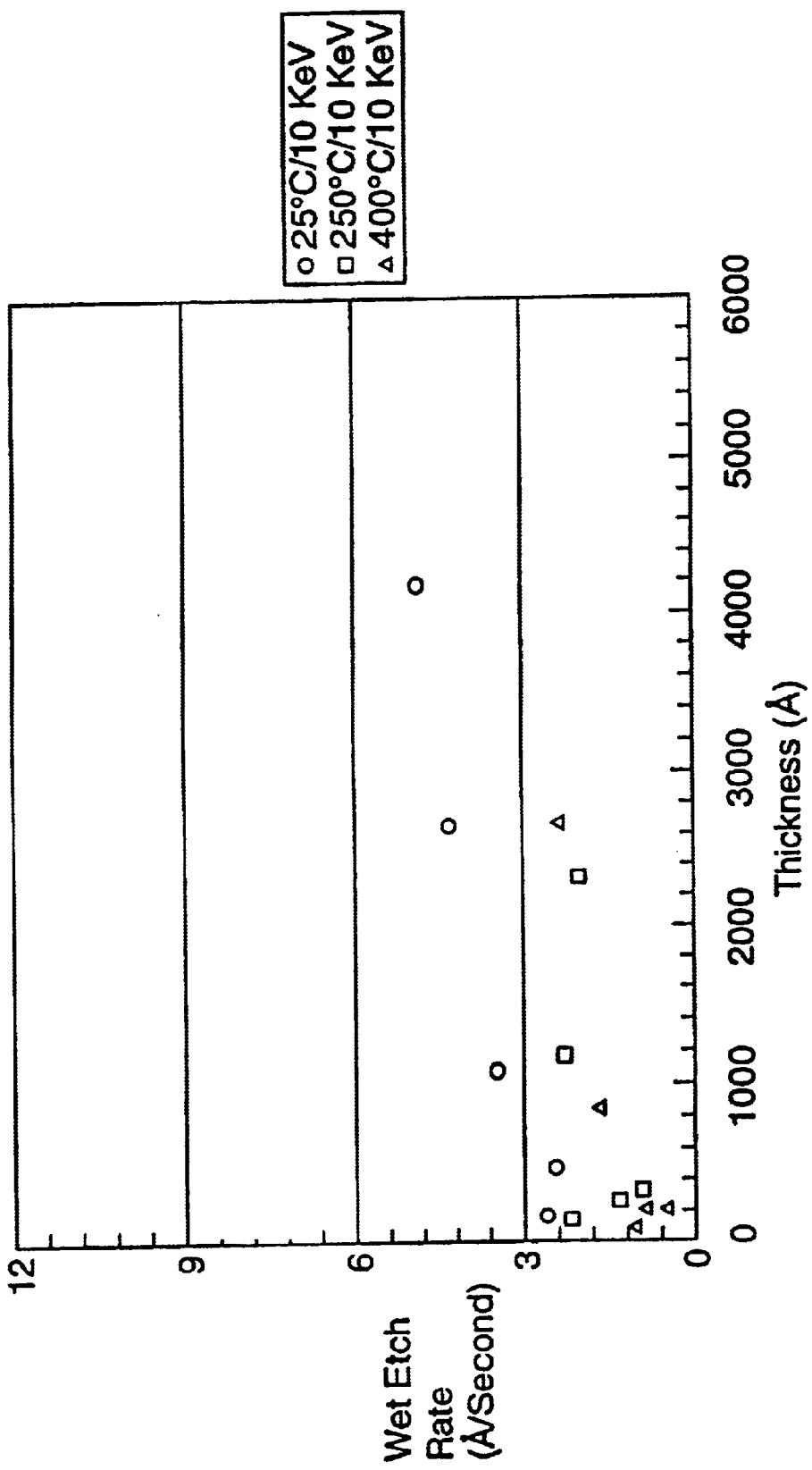

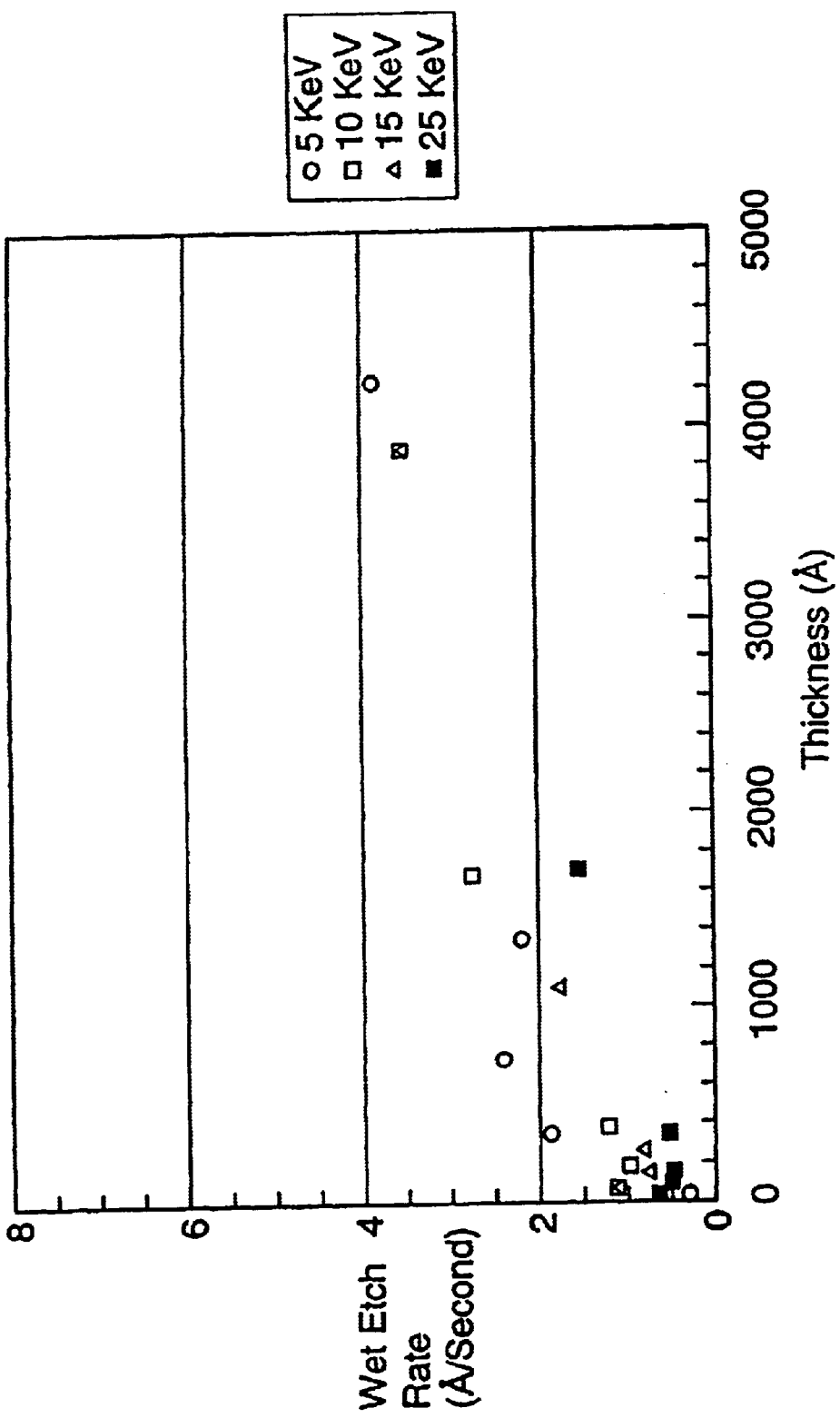

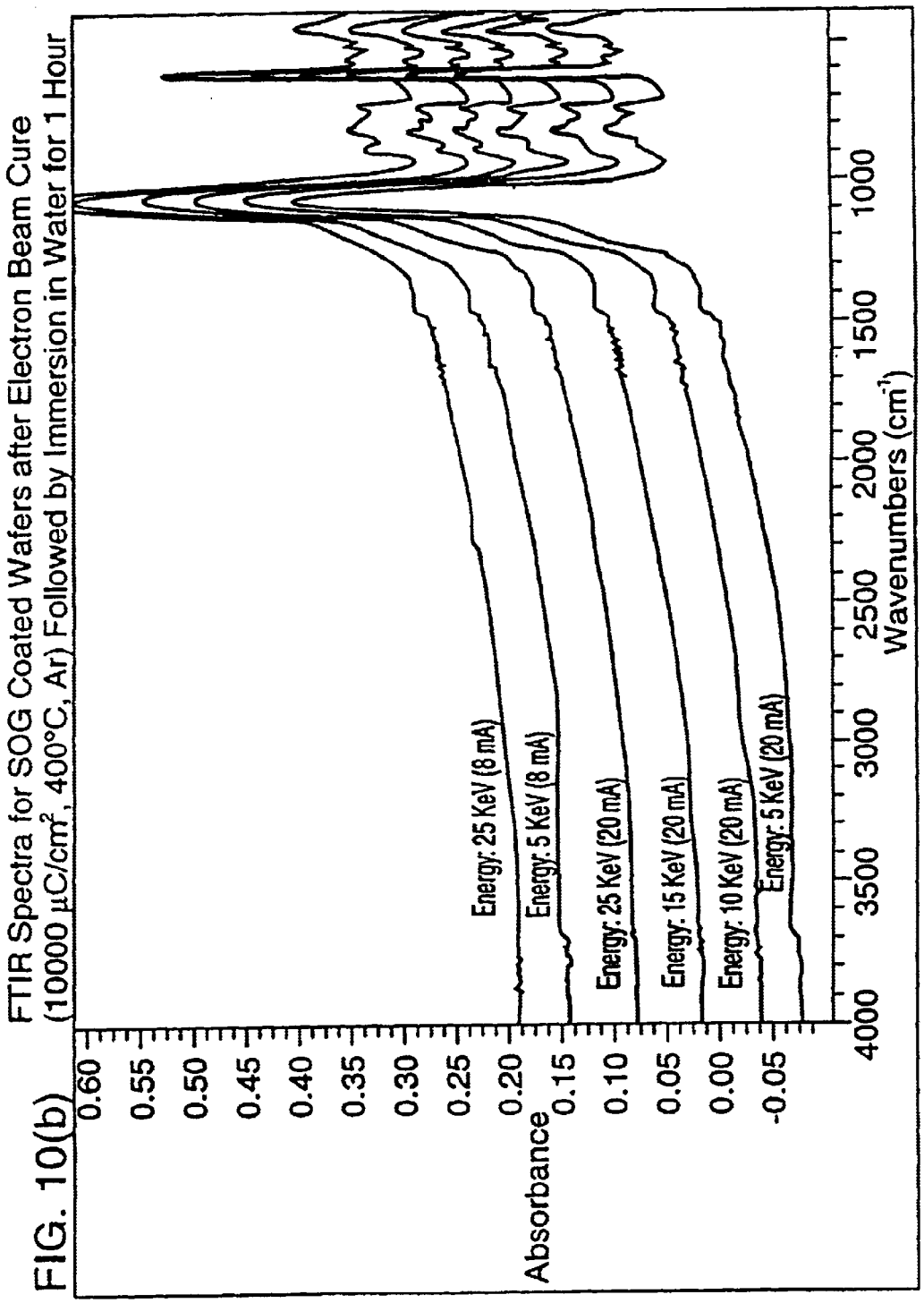
FIG. 10(b) FTIR Spectra for SOG Coated Wafers after Electron Beam Cure (10000 μC/cm², 400°C, Ar) Followed by Immersion in Water for 1 Hour

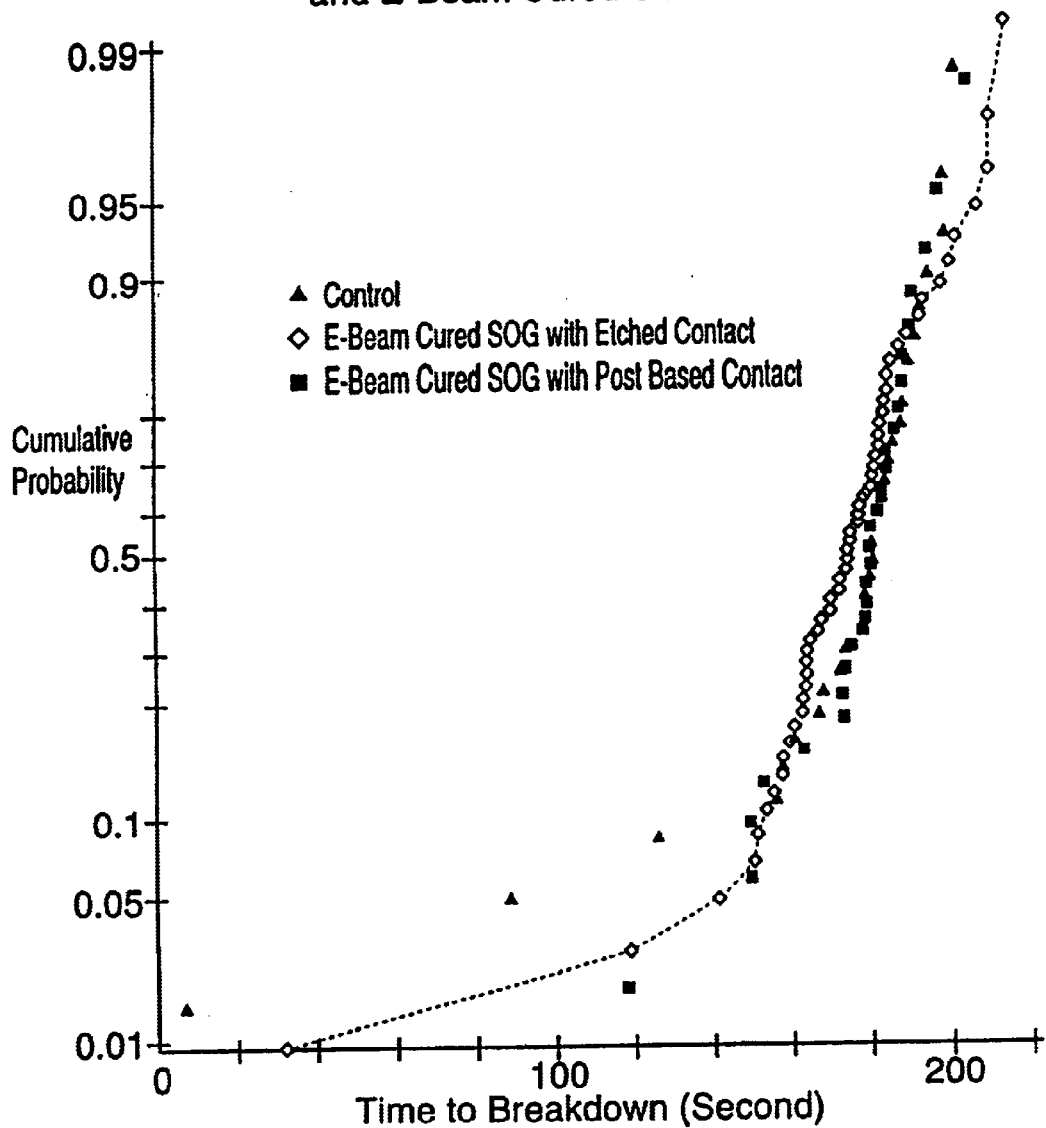

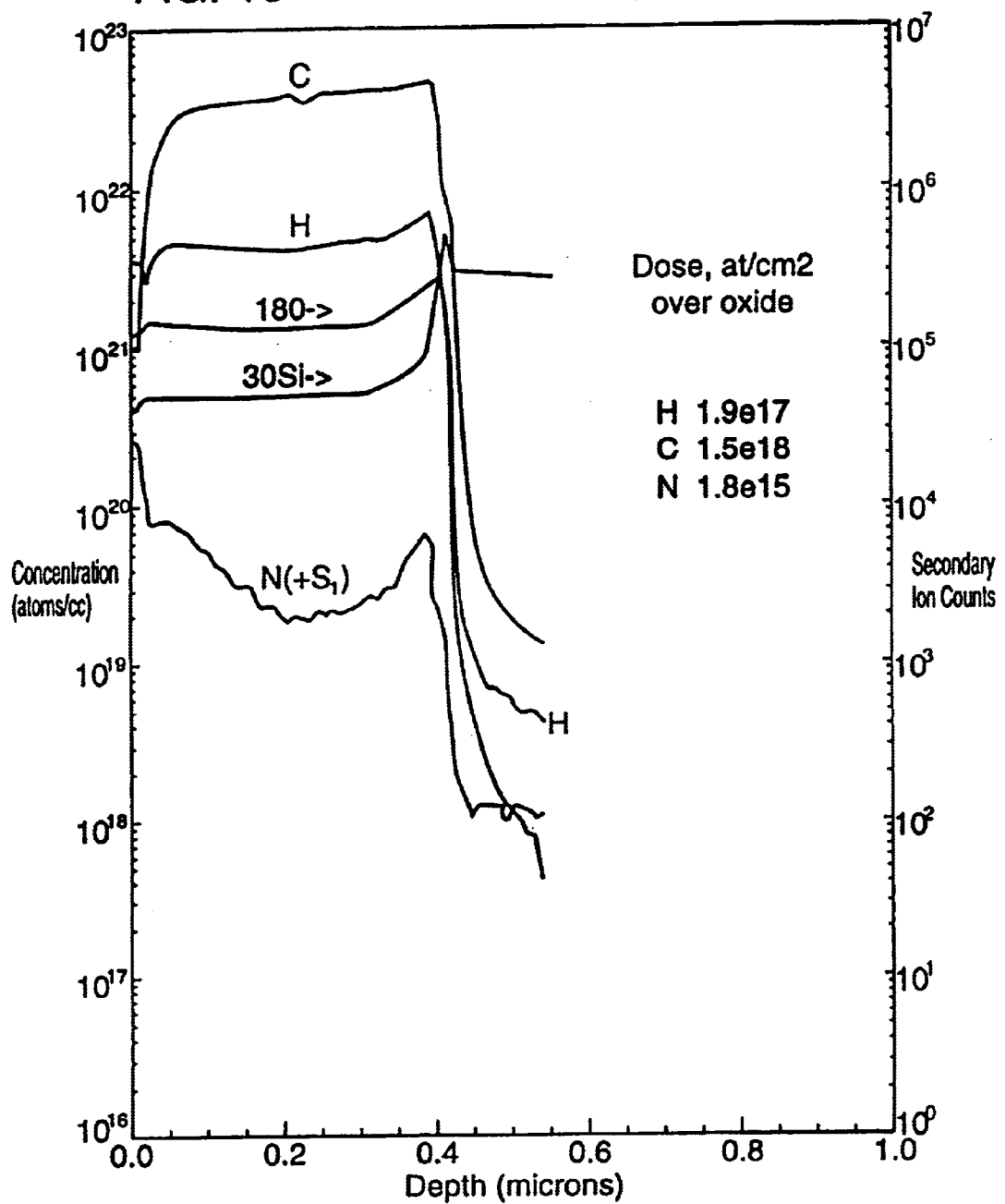
FIG. 13  SIMS Profile Analysis

ELECTRON-BEAM PROCESSED FILMS FOR MICROELECTRONICS STRUCTURES

CROSS REFERENCE TO RELATED APPLICATIONS

This application claims the benefit of U.S. provisional application Ser. No. 60/000,239 filed on Jun. 15, 1995, which is incorporated herein by reference.

BACKGROUND OF THE INVENTION

1. Field of the Invention

The present invention relates to electron-beam processed films for microelectronics structures, such as integrated circuits ("IC"). More particularly, this invention relates to an improvement in the method of processing such films which results in uniform, dense films, some of which also possess a low dielectric constant and a low wet etch rate.

2. Background of the Invention

Various devices, such as multichip modules, printed circuit boards, high-speed logic devices, flat panel displays, integrated circuits and other microelectronics devices, require deposited or spun-on dielectric films.

One commonly used technique to produce such a desirable film onto a substrate involves thermal anneal or thermal cure at a temperature range between 350° C. and 900° C. for about 1 hour. See "Spin/Bake/Cure *Procedure for Spin-On-Glass Materials for Interlevel and Intermetal Dielectric Planarization*" brochure by AlliedSignal Inc. (1994) (thermally cured spun-on films) and Kern, W., "*Deposited Dielectrics for VLSI*,"8(7) Semiconductor International 122 (July 1985)["Kern"]; Gorczyca, T. B., et al., "*PECVD of Dielectrics*,"8(4) VLSI Electronics Microstructure Science (New York 1984)["Gorczyca"]; and Mattson, B., "*CVD Films for Interlayer Dielectrics*," Solid State Technology 60 (January 1980)["Mattison"](thermally annealed chemical vapor deposited ("CVD") films). However, several disadvantages are associated with thermal processing.

In applications wherein a spin-on glass film ("SOG") is spun onto a substrate, siloxane-type SOGs are susceptible to damage by oxygen plasmas. During subsequent IC processing, SOGs which have been damaged by oxygen plasma are prone to outgassing of moisture, which often leads to electrical and mechanical reliability failures. In addition, the thermally cured SOGs' instability to oxygen plasma also contributes not only to manufacturing difficulties such as delamination, but also to physical, mechanical and cosmetic deficiencies in the final product such as increased porosity, increased shrinkage, and poor planarization.

Second, the use of such high temperatures for curing silicate SOGs also causes the oxidation and degradation of silicides. This often leads to device failures caused by silicide degradation or degradation of the shallow dopant profiles in advanced ICs. Further, the presence of this oxidized surface layer disadvantageously affects the overall electrical performances of the IC by increasing the resistance or removing the electrical contact to silicides as well as by contributing to degradation of interconnections between transistors.

In applications wherein the substrate is coated with a CVD film, an additional annealing step at high temperatures up to about 1000° C. is also required in order to improve the quality of the CVD film. However, this leads to complications and device failure problems such as silicide degradation, hot carrier degradation, device instabilities, and the like. Though these difficulties are similar to those observed with thermal processing, the magnitude of the effects is greater because the temperatures involved are significantly higher.

In growing ultra-thin gate oxides and nitrides on substrates, one known problem is the inability to control the uniformity of their growth. Prior art methods for growing such oxides employ single wafer Rapid Thermal Processing systems ("RTP") or furnaces as described in, for example, Sheets, R., "Rapid Thermal Processing Systems," Microelectronic Mfg. and Test, 16 (July 1985). However, growth failure will occur in these methods if contaminants are present at amounts as low as parts per billion. This inability to produce such uniform oxides and nitrides often leads to subsequent burning of the oxide or nitride during operation of the IC and thus affects its overall reliability.

It is desirable for all advanced ICs to possess a dielectric material having a low dielectric constant. Generally, CVD films do not possess low dielectric constants unless they are doped with high levels of fluorine. See Takeshi, S., et al., "*Stabilizing Dielectric Constants of Fluorine-Doped-Silicon Dioxide Films by $N_2O$-Plasma Annealing*," Dielectrics for VLSI/ULSI multilevel Interconnection Conference (DUMIC) (Febuary 1995). However, such fluorine-doped oxides are usually unstable and susceptible to degradation in moist and oxygen plasma environments.

Although a lower dielectric constant may be obtained by using spin-on polymer-containing films ("SOPs"), such films pose great challenges for process integration due to their poor thermal stability, their tendency to degrade when exposed to oxygen plasmas, and their tendency to decompose at temperatures typically used for metal layer deposition in ICs. Furthermore, the lowest dielectric constant that can be achieved for SOGs which have been thermally cured is typically only about 3.8–4.1. Such dielectric values may not be suitable for the end uses of the next generation microelectronic applications due to more stringent controls on mechanical and electrical effects such as capacitance that are becoming more critical as device dimensions are reduced.

It would be desirable to provide an improved process for rapidly processing dielectric film coatings on substrates at low temperatures which would result in a product that was thermally stable and insensitive to oxygen plasma. It would also be desirable to provide a uniformly dense SOG or CVD material possessing a low dielectric constant. Moreover, it would be desirable to uniformly grow ultra-thin gate oxides on substrates.

SUMMARY OF THE INVENTION

In accordance with this invention, there is provided an improvement in the curing of a dielectric material on a substrate comprising:
(a) applying to a surface of the substrate a dielectric material; and
(b) exposing said dielectric material to electron beam radiation under conditions sufficient to cure the dielectric material.

In accordance with another aspect of this invention, there is provided an improvement in the annealing of a substrate coated with a chemical vapor deposited material comprising:
a) applying to the surface of the substrate the chemical vapor deposited material; and
b) exposing the chemical vapor deposited material to electron beam radiation under conditions sufficient to anneal the chemical vapor deposited material.

In accordance with another aspect of this invention, there is provided an improvement in the growth of ultra-thin film oxides or nitrides on a substrate comprising:

a) exposing a surface of the substrate to electron beam radiation in the presence of a material in a gaseous state and under conditions sufficient to ionize the material and promote an oxidization or nitridation reaction on the surface of the substrate.

In accordance with yet another aspect of this invention, there is provided a substrate coated with an electron beam processed film produced according to the above processes.

In accordance with another aspect of this invention, there is provided a process for reducing the dielectric constant in dielectric film and chemical vapor deposit film coated substrates comprised of exposing said film to electron beam radiation under conditions sufficient to process said film.

In accordance with another aspect of this invention, there is provided a process for producing silicon rich films from chemical vapor deposit coatings comprised of exposing said coatings to electron beam radiation under conditions sufficient to process said film.

In yet another embodiment of this invention, there is provided a microelectronic device containing a substrate coated with an electron-beam processed film, wherein the dielectric constant of said electron-beam processed film is less than about 3.

The electron-beam processed films of this invention not only advantageously form a dense, uniform coating on substrates, but also electron beam cured SOG films possess a dielectric constant which is significantly lower than that reported for similar compositions which were thermally treated at high temperatures. Moreover, the time and temperature for processing such films is significantly reduced.

BRIEF DESCRIPTION OF THE DRAWINGS

The invention will be more fully understood and further advantages will become apparent when reference is made to the following detailed description of the invention and the accompanying drawings in which:

FIG. 1 is a graph of absorbance versus wave number ($cm^{-1}$) for the Fourier Transform Infrared Spectra ("FTIR") of siloxane SOG coated wafers which were either hot plate baked, thermally cured or electron-beam cured.

FIGS. 2 (a) and (b) are graphs of absorbance versus wave number ($cm^{-1}$) for the FTIR spectra of siloxane SOG coated wafers cured with electron beams at various beam doses and cure temperatures.

FIG. 3 is a graph of percent film shrinkage versus electron beam dose ($\mu C/cm^2$) for siloxane SOG coated wafers cured via thermally and by electron beam radiation.

FIG. 4 is a graph of percent film shrinkage versus electron beam energy (KeV) for electron-beam cured siloxane SOG coated wafers.

FIGS. 6(a), (b), (c), and (d) are graphs of wet etch rate (Å/sec) in B.O.E. 50:1 as a function of the depth of film thickness (Å) for electron-beam cured SOG coated wafers.

FIG. 7 is a graph of the wet etch rate (Å/sec) in B.O.E. 50:1 as a function of the depth of film thickness (Å) for electron-beam cured SOG coated wafers at various degrees of electron beam energy (KeV).

FIG. 12 is a graph of cumulative probability of time to breakdown ("QBD") versus time to breakdown (seconds) of a gate oxide with a tetra-ethyl orthosilicate ("TEOS")-capped electron-beam cured SOG.

FIG. 13 is a graph of depth (microns) versus concentration (atoms/cc) for secondary ion mass spectroscopy ("SIMS") depth profile analysis for Na, K, H, C, and O impurities though the said oxide thickness.

DESCRIPTION OF THE PREFERRED EMBODIMENTS

Figure 5:
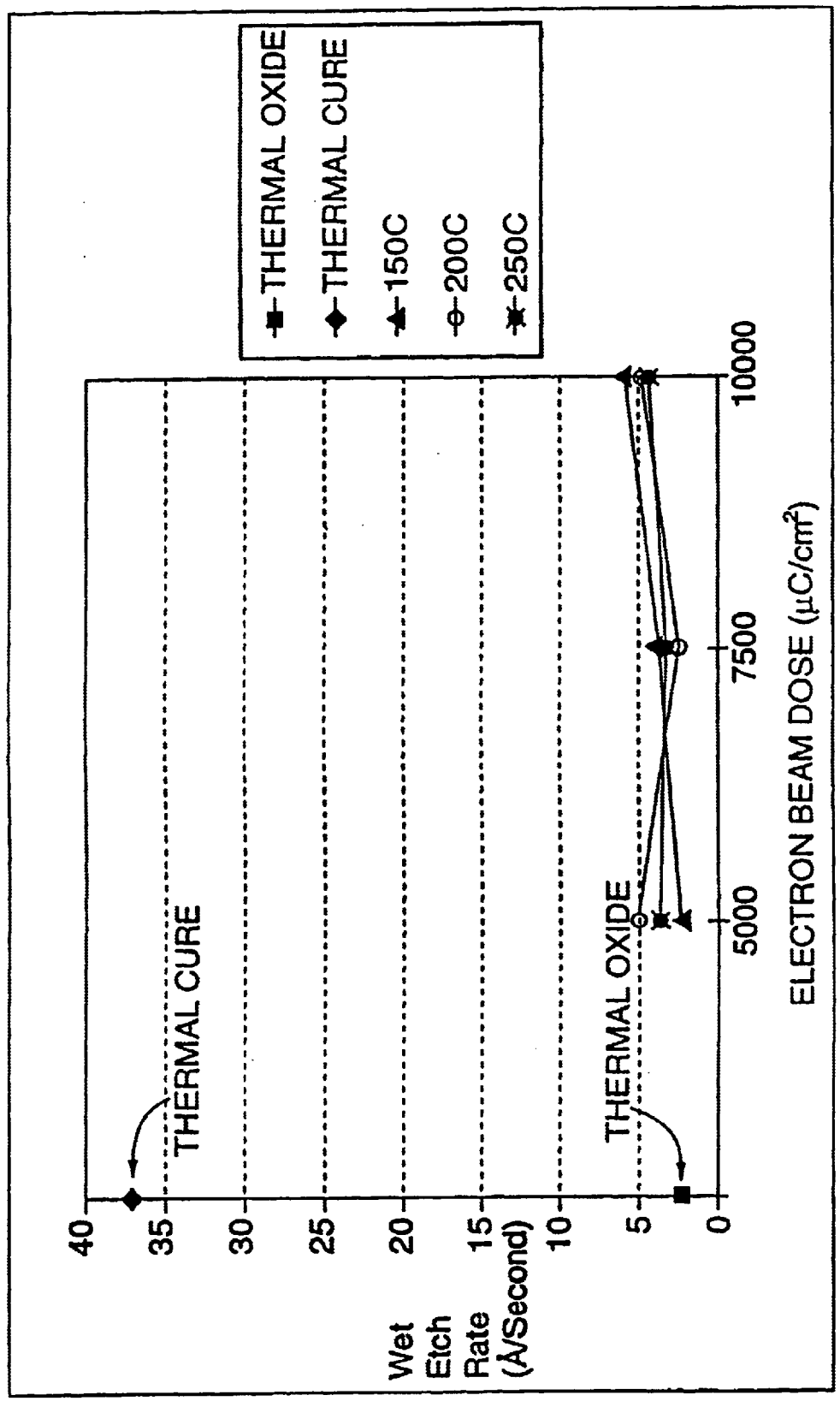
FIG. 5 is a graph of wet etch rate (Å/sec) in buffered oxide etch ("B.O.E.")50.1 for thermally cured SOG coated wafers, for thermal oxide wafers and for electron beam cured SOG coated wafers as a function of electron beam dose ($\mu C/cm^2$).

Unless indicated otherwise, all references herein are specified in weight. "Dose" as used herein shall refer to doses of electron beam radiation.

Various materials may be applied onto the substrates of the present invention via "spinning-on", CVD, or growing techniques.

Suitable dielectric materials or SOG which may be spun-on to substrates include silicates, phosphosilicates, siloxanes, phosphosiloxanes, and mixtures thereof. Siloxanes are preferred. More preferable siloxanes are amorphous, crosslinked glass-type materials having the formula SiOx wherein x is greater than or equal to one and less than or equal to two, and possess a "pre-exposure" content, based upon the total weight of the siloxane materials, of from about 2% to about 90%, and preferably from about 10% to about 25% of organic groups such as alkyl groups having from about 1 to about 10 carbons, aromatic groups having from about 4 to about 10 carbons, aliphatic groups having from about 4 to about 10 carbons, and mixtures thereof. Optionally, the siloxane and silicate materials may also contain, based upon the total mole percent of the dielectric materials, from about 0% to about 10%, and preferably from about 2 % to about 4% phosphorus.

Preferred siloxane materials suitable for use in this invention are commercially available from AlliedSignal Inc. under the tradename "Accuglass" ®.

Suitable siloxane materials contain about 100 parts per billion or less, preferably 50 parts per billion or less, and more preferably 10 parts per billion or less of trace element impurities such as sodium, potassium, chlorine, nickel, magnesium, chromium, copper, manganese, iron, calcium, and the like, and preferably have a molecular weight between from about 300 to about 50,000, and more preferably from about 500 to about 10000 molecular weight units.

The dielectric material may be applied to substrates via conventional spin-coating, dip coating, spraying, or meniscus coating methods well-known in the art. Details of such methods are described in, for example, "Processing Equipment and Automated Systems", brochure by Integrated Technologies.

The thickness of the dielectric film on the substrate may vary depending upon the amount of SOG liquid that is applied to the substrate, but typically the thickness may range from about 500 Å to about 20000 Å, and preferably from about 3000 Å to about 9000 Å. The amount of SOG liquid applied to the substrate may vary between from about 1 ml to about 10 ml, and preferably from about 2 ml to about 8 ml.

In a preferred embodiment, the siloxane material is centrally applied to a substrate, which is then spun at speeds ranging between about 500 and about 6000 rpm, preferably between about 1500 and about 4000 rpm, for about 5 to about 60 seconds, preferably about 10 to about 30 seconds, in order to spread the solution evenly across the substrate surface.

Suitable materials which may be deposited onto substrates via CVD include plasma-enhanced tetra-ethyl ortho silicate ("PETEOS"), silane based oxides such as silane and di-silane, boron-phosphosilicate glass ("BPSG"), phosphosilicate glass ("PSG"), nitrides such as silicon nitride (SiN) and non-stoichiometric mixtures therewith, anhydride films, oxynitrides such as those deposited with silane ($SiH_4$), ammonia ($NH_3$), nitrogen, and nitrous oxide ($N_2O$) and mixtures thereof, and borophospho glass from tetraethyl orthosilane ("BPTEOS"), and mixtures thereof. Silane-based oxide films are preferred.

The CVD film may be applied to the substrate in the presence of a gas via conventional CVD methods well-known in the art. Details of such methods are well known in the art and are described in, for example, Gorczyca; Kern, and Mattison, which are incorporated herein by reference. The gas selected for CVD applications depends upon the type of film desired, but typically such gases include a mixture of TEOS and oxygen, or a mixture of oxygen, silane and optionally diborane ("$B_2H_6$"), phosphine ("$PH_3$"), and nitrous oxide ("$N_2O$"), and preferably TEOS.

The amount of CVD coating deposited onto the surface of the substrate is proportional to the film thickness desired and may range from about 1000 Å to about 30000 Å, and preferably from about 3000 Å to about 8000 Å. The amount of CVD applied to the substrate may vary according to the film thickness desired. Gas flows required to obtain these thicknesses are described in Kern; Gorczyca; and Mattison.

Typically, the SOG or CVD films are applied onto, and the ultra-thin oxide or nitride films are grown on a wafer or other planar substrate, such as silicon wafers which have a circuit pattern on their surface, to be processed into ICs or other microelectronic devices. Typically, the diameters of the substrates range from about 2 inches to about 12 inches, although the present invention would still be effective for larger substrates.

Optionally, the pre-cured SOG-coated substrate may be heated at a temperature of about 50° C. to about 250° C. for about 1 to about 3 minutes. In a preferred embodiment, the pre-cured SOG is first heated at about 50° C. for about 30 seconds to one minute, then heated at about 150° C. for about 30 seconds to one minute, and heated a third time at about 250° C. for about 30 seconds to one minute. The pre-cured liquid SOG material partially crosslinks and solidifies as a result of such heating.

The SOG coated substrate is cured by exposing the surface of the substrate to a flux of electrons while in the presence of a gas selected from the group consisting of oxygen, argon, nitrogen, helium and mixtures thereof, and preferably oxygen, argon, nitrogen, and mixtures thereof. Nitrogen gas is more preferred.

The temperature at which the electron beam exposure is conducted will depend on the desired characteristics of the resulting film and the length of desired processing time. One of ordinary skill in the art can readily optimize the conditions of exposure to get the claimed results but the temperature will generally be in the range of about 25° C. to about 400° C. The pressure during electron beam curing will range between from about 10 mtorr to about 200 mtorr, and preferably from about 10 mtorr to about 40 mtorr.

The period of electron beam exposure will be dependent upon the current density and the beam dosage to be applied to the substrate. One of ordinary skill in the art can readily optimize the conditions of exposure to get the claimed results, but generally the exposure will range from about 2 to about 45 minutes, and preferably from about 5 to about 25 minutes with application of an electron beam dose of about 1000 to about 50,000, preferably from about 2500 to about 10,000 $\mu C/cm^2$. The accelerating voltage of the electron beam may vary from about 1 to about 25 KeV. The amount of dose and the accelerated voltage selected will be dependent upon the characteristic and thickness of the films to be processed.

The coated SOG substrate may be exposed to electron beams in any chamber having a means for providing electron beam radiation to substrates placed therein. Typically, the chamber is also equipped with a means for emitting electrons into a gaseous atmosphere comprising oxygen, argon, nitrogen, helium and mixtures thereof, and preferably oxygen, argon, and nitrogen, simultaneously with electron beam exposure.

In a preferred embodiment, the coated SOG substrate is placed into a chamber which is commercially available from Electron Vision, San Diego, Calif., under the tradename "ElectronCure"™, the principles of operation and performance characteristics of which are described in U.S. Pat. No. 5,003,178, which is incorporated herein by reference. This chamber beneficially provides a "wide, large beam" of electrons which may affect an area of from about 4 to about 144 square inches.

Similarly, CVD coated films are annealed via the same process and under the same conditions as described for curing SOG coated substrates.

For applications in which ultra-thin gate oxides or nitrides are grown on substrates, the type of film which is grown depends upon the composition of the substrate and the substance grown in the gaseous state selected. Any compositions such as gallium arsenide (GaAs) or compositions containing silicon such as crystalline silicon, polysilicon, amorphous silicon, or epitaxial silicon, and preferably silicon dioxide ($SiO_2$) are suitable substrate materials. The growth of the oxides or nitrides occurs in the presence of oxygen, ammonia, nitrogen, nitrous oxide, and reaction products and mixtures thereof in the form of a gas, a sublimed solid or a vaporized liquid. Oxygen gas is preferred.

According to the present invention, the oxide or nitride ultra thin film layer is grown on the substrate surface simultaneously with the period in which it is exposed to electron beams in the presence of a gas. The period of electron beam exposure occurs for a time sufficient to allow the gas to both ionize and react with the compounds present on the surface of the substrate. The thickness of the grown films may range from about 10 Å to about 1000 Å, and preferably from about 50 Å to about 80 Å. Otherwise, the process and conditions for growing such oxide or nitride ultra thin film layers are similar to those described for curing SOG coated substrates. As a result, both the uniformity of the composition and thickness of the ultra-thin oxide or nitride films grown on the substrate is improved.

As a result of exposing a coated substrate to electron beam radiation according to the present invention, the films produced thereon are unexpectedly modified into a new, unique chemical form. For example, "FTIR" analysis reports that there are no longer CH groups attached to the backbone of SOG starting compounds after they are cured with electron beams. However, Secondary Ion Mass Spectroscopy ("SIMS") analysis demonstrates that the carbon remains in the film. In comparison to thermally-cured coatings which possess oxidized carbon in the top 0.05 to 0.3 microns of the cured coatings or films, the carbon in the cured siloxane SOG and carbon-containing SOP coatings of the present invention is homogeneously distributed throughout the film.

The substrates coated with a film processed according to the present invention may be used for any dielectric and planarization application in microelectronics fabrication. One noteworthy characteristic of the SOG coatings processed according to the present invention is that they exhibit excellent dielectric properties without having to add additional polymers thereto. Dielectric properties of the SOG or SOP coatings cured according to the present invention ranged between about 2.5 to about 3.3, and preferably between about 2.9 to about 3.0.

Another noteworthy characteristic of the films processed according to the present invention is that their density increases significantly as a result of the step of electron beam processing. In addition, the processed film coatings not only have a wet etch rate in Buffered Oxide Etch "BOE"50:1 which is comparable to that recorded for thermal oxides, but there films also are resistant to oxygen plasmas, are able to be chemically and mechanically polished with good uniformities, and are able to withstand the temperature budget associated with typical W plug processing. More specifically, the siloxane coatings cured according to the present invention and subsequently exposed to nitrogen at 425° C. for one hour shrunk only 4%, and no additional shrinkage occurred when the films were exposed for up to 1 hour at 700° C.

For deposited oxides, the invention provides a means for creating densified films without employing high temperature anneals. More specifically, index of refraction analysis reveals that the result of annealing CVD films comprised of PETEOS according to the process of the present invention is a "silicon-rich" film which is unobtainable through other known means in the art such as modification of the gas ratios during film deposition or thermal annealing. This is especially beneficial because such "silicon-rich" films are known to prevent field inversion and hot electron degradation effects.

Moreover, not only are the temperatures at which the processing of the present invention occurs significantly below those employed in prior art thermal curing or annealing processes, but the time for curing or annealing such films is also significantly reduced.

The use of this invention also results in an improved ultra-thin film oxide or nitride coating for substrates whereby the growth of such oxides or nitrides may be controlled.

The present invention may be incorporated into several known processes such as: 1) disposable post processing; 2) conventionally-etched contact processing; and 3) inter-metal dielectric processing.

The following non-limiting examples illustrate the effect of exposing coated substrates to electron beam radiation in order to create a film having improved characteristics thereon.

The films produced in the following examples were analyzed according to the following test methods:

1) Film Thickness: Using a calibrated Nanospec® AFT model 010-180 computerized Film Thickness Measurement System available from Nanometrics, Co., wavelengths from about 480 nm to 790 nm were scanned through the wafer and converted to Angstroms (Å) via its internal computer. Measurements were acquired for five different locations on the wafer, then these five values were averaged.

2) Percent Film Shrinkage: This value is obtained from a ratio of thickness measurements obtained according to the procedure described in Film Thickness and recorded after various processing steps.

3) Wet Etch Rate Determination: Details for conducting this test are set forth in "Relative Etch Rate Determination[[P]', a report by AlliedSignal Inc., Advanced Microelectronic Materials Division (Nov. 30, 1995).

4) Dielectric Constant: The dielectric constant of SOG films is determined by the standard capacitance-voltage ("CV") curve technique, using metal-oxide semiconductor ("MOS") capacitor structures as would be used for any other dielectric thin films. The dielectric constant is calculated from the C(max)/C(oxide) derived from the CV curve, thickness of the film being measured, and the capacitor plate (Al dot) area.

A Hewlitt Packard Model 4061A semiconductor measurement system consisting primarily of a sensitive multifrequency (10 Khz–10 Mhz) Induction Capacitance and Resistance ("LCR") meter, current and voltage sources, ramp generator, and picoammeter was used to measure the CV curve of dielectric films. The measurement, calculation, and plotting functions are carried out by a dedicated Hewlitt Packard microcomputer through an IEEE-488 standard interface bus. Substrates are probed on a manual probe station placed inside a metal dark-box. Further details of this procedure are set forth in "SOG Dielectric Constant Theory", report by AlliedSignal Inc., Advanced Microelectronic Materials Division (Jan. 3, 1995).

5) Index of Refraction: This value is determined using a calibrated AutoEL II® Revision 307 ellipsometer available from Rudolph Research. Calibration and measurement procedures are described in "AutoEL II Revision 307 Ellipsometer Calibration and Maintenance", report by AlliedSignal, Inc., Advanced Microelectronic Materials Division (Jun. 5, 1995).

6) Fourier Transform Infrared Spectrum Analysis: Fourier transform infrared spectrum analysis reveals vibrations of atoms in molecules. Certain groups of atoms have characteristic vibration frequencies which persist in different compounds. Details such as the frequency position of infrared bands characteristic of some organosilicon groups, are described in, for example, Launer, "*Infrared Analysis of Organosilicon Compounds: Spectra-structure Correlations*", (Burnt Hills, N.Y., 1990).

7) Contact Resistance: Contact Resistance procedure is described in Loh, W. M., et al., "*Modeling and Measurement of Contact Resistances*" IEEE Transactions Electron Devices 512 (March 1987).

8) Device and Field Threshold Voltages and Transistor Voltages (Vts): These voltage measurements and techniques for obtaining such measurements similar to those employed in the Examples are described in Andoh, T., et al., "*Design Methodology for Low Voltage MOSFETS*" Int'l. Electron Device Meeting (December 1994).

9) Time to Breakdown ("QBD"): This procedure is described in Grove, Physics & Technology of Semiconductor Devices, Section 10.5 (New York 1967); Chen, K. L., et al., Tech. Digest IEDM 484 (1986).; and Rountree, R. N., Tech. Digest IEDM 580 (1988).

10) Via resistance: Via resistance was measured using techniques described in "*Pre-sputter Degassing Treatment* in Via Contact for Via Reliability Enhancement in Spin-On Glass Planarization Process" for VLSI/ULSI Multilevel Interconnection Conference (Febuary 1995).

11) Resistance and Silicide Resistance: Silicide resistance was measured using techniques described in Shimizu, S., et al., "0.15 µm CMOS Process for High Performance and High Reliability," International Electron Device Meeting (December 1994).

12) Secondary Ion Mass Spectroscopy ("SIMS"): SIMS analysis was used to determine the presence of trace elements in SOG films. First, the SOG films were measured using a Cameca SIMS device having ppb detection limits. The use of the resistive anode encoder (RAE) ion imaging detector receives input from the Cameca device and compiles data such as trace ion element concentration with time which is used to generate direct ion maps of any element on the film surface and changes in the lateral distribution of the element as a function of film depth.

The SIMS analysis was performed using a PHI-6600 quadrupole mass spectrometer in which the film was exposed to oxygen and cesium primary ion bombardments with a net impact energy of 6 KeV in order to obtain both positive and negative secondary ion mass spectrometries. The analytical conditions are reported in Table 1:

TABLE 1

| Primary ion beam | Oxygen | Cesium |
| --- | --- | --- |
| Primary Beam Energy | 6 KeV | 6 KeV |
| Beam current | 50 nA | 20 nA |
| Raster size | 150 × 150 µm | 150 × 150 µm |
| Analyzed Area | 45 × 45 µm | 45 × 45 µm |
| Secondary ion polarity | + | − |
| Charge Neutralization | on | on |
| Mass resolution | 300 | 300 |

The data have been plotted as concentration (atoms/cm$^3$) versus depth for the analytes. The conversion of secondary ion counts to concentrations is based on a relative sensitivity factors (RSFs) derived from the analyses of ion implant standards of known dose in $SiO_2$. The analytes' secondary ion counts were rationed to average matrix$^{30}$ Si signal through oxide. The reproducibility of analysis typically is less than ±10% at ion counting rates above 1×10$^3$. The sputter depth was calibrated by measuring a crater depth using Tencor P-10 surface profiler. Additional specifics of this technique is further described in brochures published by Charles Evans and Associates (October 1993).

EXAMPLES

Example 1

Preparation of SOG Coated Substrate

A silicon wafer having a diameter of 6 inches was coated with a siloxane SOG available from AlliedSignal Inc. under the tradename "Accuglass" ®311 by dispensing about 3 ml to about 4 ml of SOG onto the surface of the wafer, which was then spun on a SOG coater track available from Dai Nippon Screen, Inc. at about 350 rpm for 2 seconds at 72° F., 20–30 mmHg, and a spin cup humidity of 40%. After the coated wafer was additionally spun at about 3000 rpm for about 20 seconds under similar conditions, the wafer was then heated on hot plates in the DNS SOG coater track for three consecutive intervals of 120 seconds at 80° C., 120° C., and 175° C., respectively.

Example 2

Thermal Cure of SOG Coated Wafer (Comparative)

A wafer produced according to Example 1 was then cured in a Black-Max-type furnace available from MRL Industries for 1 hour at 425° C. and 1 atm in the presence of nitrogen.

Analysis of the resulting coated wafer indicated a film thickness (post-cure) of 3000 Å, a film shrinkage of 7%, and a wet etch rate of about 37 Å/sec.

Example 3

Electron Beam Cure of SOG Coated Wafer

Wafers produced according to Example 1 were placed into a chamber available from ElectronVision under the tradename "ElectronCure" ™ and exposed to an electron beam having a current of 8 to 20 mA, a dose from 1000 to 10000 µC/cm$^2$ and an accelerating voltage from 5 to 25 KeV, in the presence of various gases including nitrogen, oxygen, argon, and hydrogen, respectively, and under a temperature from 25 to 400° C. and a pressure range from 10 to 40 mtorr.

Analysis of the electron-beam cured SOG coated wafers indicated a film shrinkage of 10–30%, and a wet etch rate in buffered oxide etch in 50:1 (deionized water: hydrofluoric acid ("HF")) solution of 1–11 Å/sec depending upon the dose, energy and temperature selected.

FIG. 1 illustrates the FTIR spectra for wafers thermally cured according o Example 2, electron-beam cured according to Example 3, and uncured, i.e. hot-baked, according to Example 1. As evidenced by the absence in absorbance increases indicating CH stretching modes in the FTIR spectra of FIG. 1 and the homogeneous distribution of carbon as indicated by the carbon peak in the SIMS spectra of FIG. 13, it is apparent that the composition of the films after exposure to electron beam processing has changed and that the water was not absorbed therein.

Example 4

Wafers Cured at Varying Temperatures and Doses of Electron Beam

Wafers were produced according to Example 1 and cured according to Example 3 except that each wafer was exposed to one of four doses of 1000, 3000, 5000, or 10000 µC/cm$^2$ at an energy of 10 KeV under a temperature of either 25° C., 250° C., or 400° C. in the presence of argon gas.

FIGS. 2(a) and 2(b) illustrates the FTIR spectra for each of the wafers produced according to Example 4. As evidenced by the increase in absorbance between 3600 and 3700 cm$^{-1}$ in FIG. 2(a), wafers which were exposed to 1000 and 3000 µC/cm$^2$ at any of the three temperatures showed hydroxyl group stretching, which is indicative of the presence, of residual water in the film. However, by increasing electron beam dose equal to or greater than 5000 µC/cm$^2$, the water in the film can be greatly reduced or entirely eliminated, as illustrated in FIG. 2(b).

Example 5

Comparison of Film Shrinkage for Electron Beam Cured Wafers at Varying Doses, Energies and Temperatures and for Thermally Cured Wafers Wafers were produced and cured according to Examples 1 and 3, then were analyzed for film shrinkage by measuring the film thickness after bake and electron beam cure.

FIG. 3 illustrates the film shrinkage as a function of electron beam doses at temperatures of 25° C., 250° C. and 400° C. in comparison with the film shrinkage of the thermally cured films. FIG. 4 shows the film shrinkage versus electron beam energy. It is apparent from FIGS. 3 and 4 that the shrinkage of electron beam cured films is generally greater than that of thermally cured films. Furthermore, as the dose increases, the film shrinkage for the electron beam cured films also increases. In addition, the influence of temperature upon film shrinkage was observed only for films cured with low electron beam doses; however, film shrinkage was relatively insensitive to variations in electron beam radiation at doses in excess of 10000 $\mu C/cm^2$ and temperatures above 400° C.

Example 6

Comparison of Wet Etch Rates for Electron Beam Cured Wafers at Varying Doses and Temperatures for SOG. Thermal Oxide. and Thermally-Cured SOG Wafers Wafers were produced and cured according to Examples 1 and 3, then were analyzed for Wet Etch Rate.

On an uncoated wafer, a thermal oxide film was grown in a diffusion furnace such as those referenced in Example 2 under a temperature of about 1050° C. and atmospheric pressure in the presence of oxygen at a gas flow of 4 liters/minute.

Wet etch rates of various films in buffered oxide etch in 50:1 solution was determined by measuring the remaining film thickness after every immersion in the solution for 1 to 5 minutes depending upon the wet etch rate of the film.

FIG. 5 presents the wet etch rate versus dose for the electron beam cured wafers in addition to the wet etch rate for the thermally cured wafer and the thermal oxide wafer. It is evident from FIG. 5 that the wet etch rate of SOG coated wafers cured with electron beams is in the range of 3 to 5 Å/sec., which is very close to the 3 Å/sec etch rate measured for the thermal oxide wafer, but is considerably lower than the 37 Å/sec etch rate measured for the thermally cured SOG wafers. The low etch rate demonstrated by the SOG coated wafers indicates that such SOG films are significantly more dense in comparison to the thermally grown oxide films.

FIGS. 6($a$) to ($d$) illustrate the variation of wet etch rate with the depth of film thickness for electron beam cured films at doses of 1000, 3000, 5000 and 10000 $\mu C/cm^2$, respectively. It is apparent from FIGS. 6($a$) and 6($b$) that the wet etch rates for films cured under temperature conditions ranging between 25° C. to 400° C. and a dose of 1000 $\mu C/cm^2$ as well as for films cured at a temperature of 25° C. and a dose of 3000 $\mu C/cm^2$ were relatively constant throughout the entire thickness of the film. This consistency in wet etch rate values indicates that it is possible to produce films having a highly uniform density using the above electron beam process conditions.

As illustrated in FIGS. 6($b$) through 6($d$), the wet etch rate increases with the increase in film thickness up to about 1500 Å and then remained relatively constant for films cured at temperatures of 250° C. through 400° C. and a dose of 3000 $\mu C/cm^2$ as well as for films cured at any temperature and a dose equal to or higher than 5000 $\mu C/cm^2$.

Similarly, FIG. 7 shows that the wet etch rates for films cured at a temperature of 400° C., an electron beam energy ranging between 5 KeV and 25 KeV, and a dose of 1000 $\mu C/cm^2$ are also relatively constant.

Example 7

FTIR Results for Electron Beam Cured Wafers Subjected to Chemical-Mechanical Polish Followed by Oxygen Plasma Ashing Coated wafers were produced and cured according to the process set forth in Examples 1 and 3, then polished and cleaned with HF according to the process set forth in Example 13, followed by ashing with oxygen plasma. The detail of oxygen plasma ashing is described in, for example, C. K. Wang, et al., "A Study of Plasma Treatments on Siloxane SOG", VIMIC Conference (June 1994).

Figure 8:
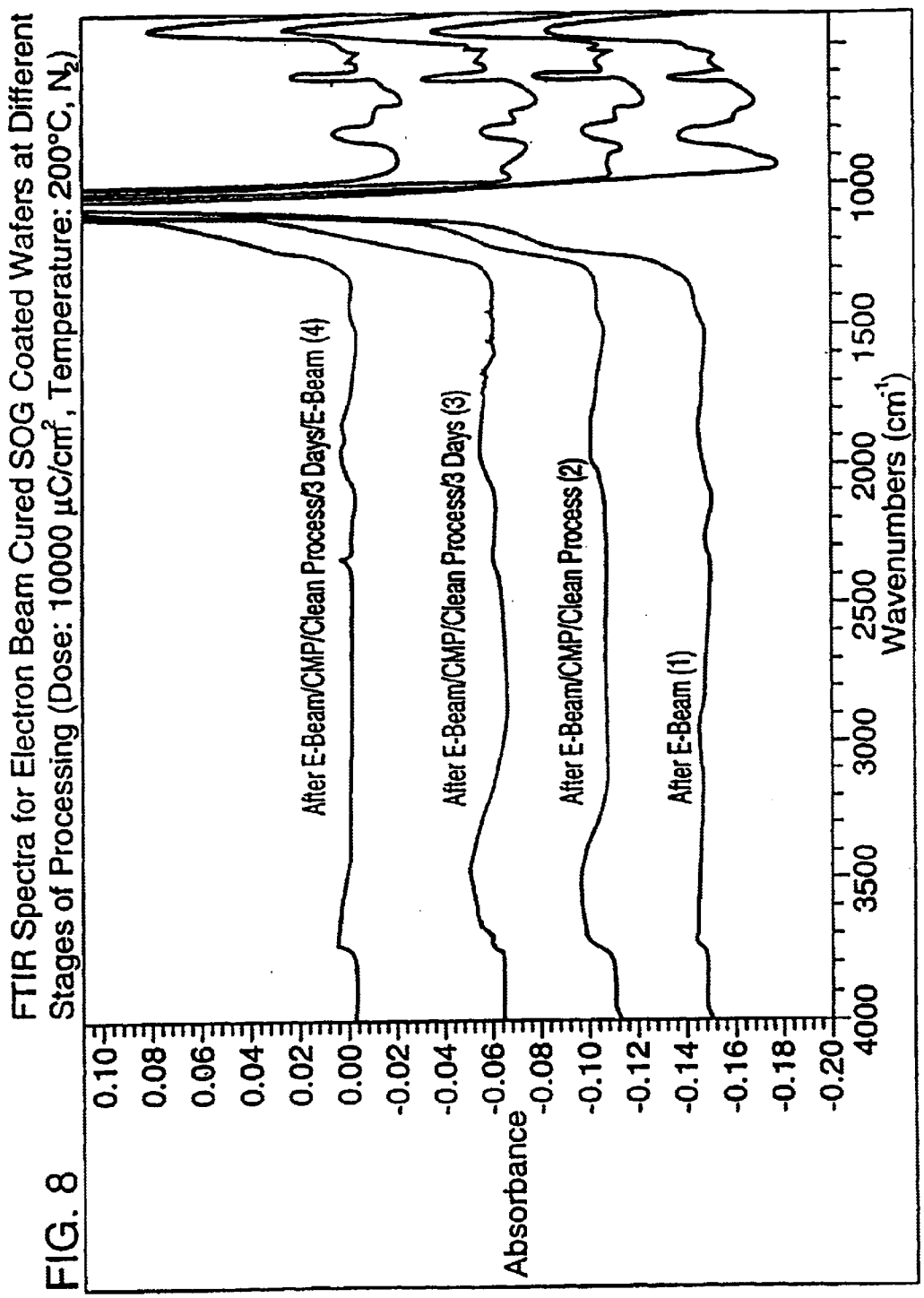
FIG. 8 is a graph of absorbance versus wavenumber ($cm^{-1}$) for the FTIR spectra of electron-beam cured SOG coated wafers after completion of various stages of processing.

FIG. 8 presents the FTIR spectra for these films at various stages of curing: (1): after curing with electron beam radiation at a dose of 10000 $\mu C/cm^2$ and a temperature of 200° C.; (2): after the cured film of Stage (1) was subjected to chemical-mechanical polish ("CMP") followed by wet clean in HF solution and oxygen plasma ashing; (3): after three day's exposure in ambient conditions following Stage (2); and (4): after re-exposure to electron beam radiation under the conditions of Stage (1) following the ambient exposure of Stage (3).

FIG. 8 illustrates an increase in absorbance at wavelengths between 3600 and 3700 $cm^{-1}$ which is indicative of hydroxyl stretching in the films and thus an increase in the film's moisture intake. The hydroxyl group stretching is particularly apparent after the CMP and clean processes of Stage (2). However, this moisture could be removed by re-exposure of the films to electron beam processing as shown in FIG. 8.

Example 8

FTIR Results for Electron Beam Cured Films After Exposure to Ambient Environment and Optional Immersion in Water After producing and curing wafers according to the processes set forth in Examples 1, 2 and 3, FTIR analysis was performed.

Figure 9:
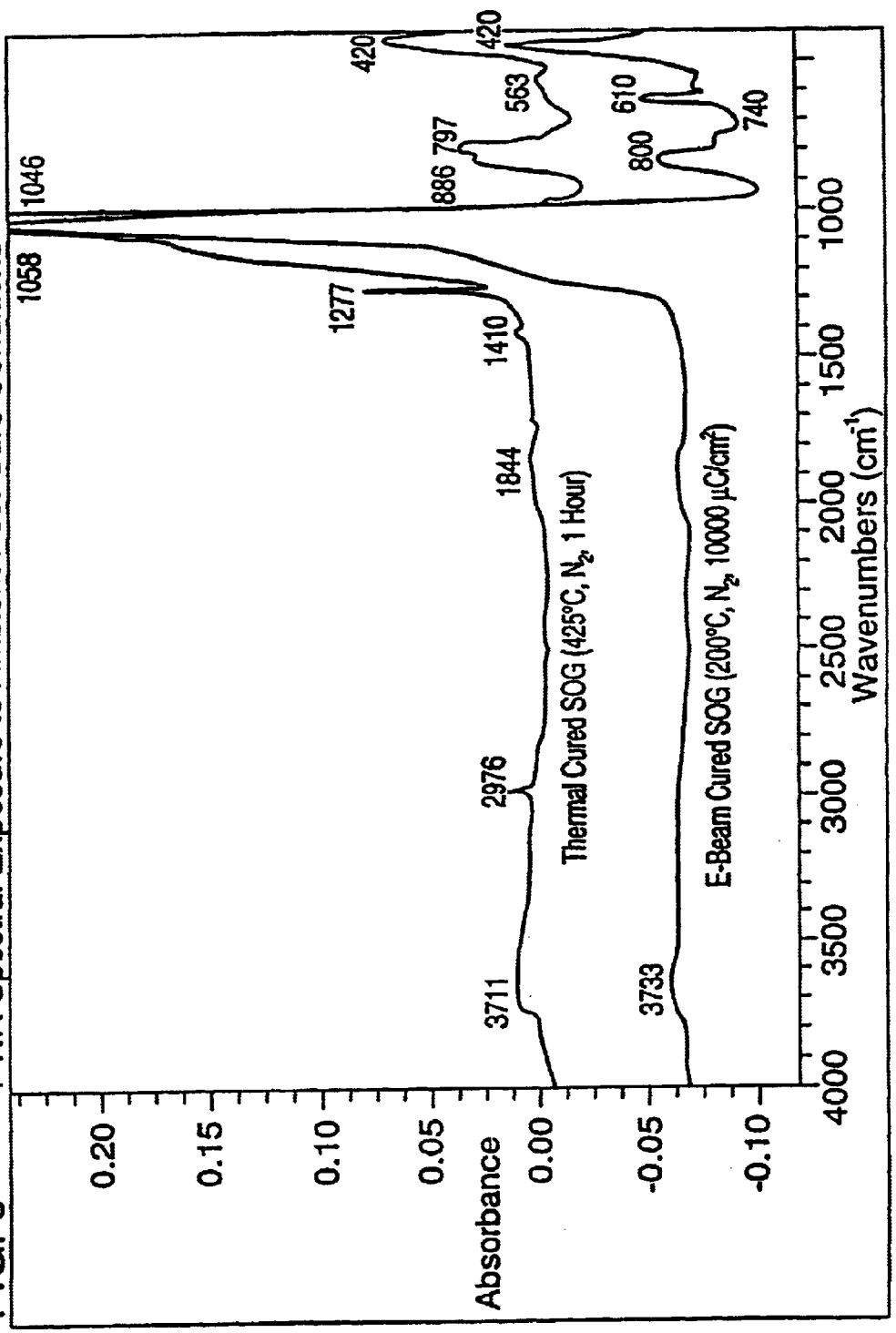
FIG. 9 is a graph of absorbance versus wavenumber ($cm^{-1}$) for the FTIR spectra of a thermally cured SOG film and for an electron beam cured SOG film which were both exposed to post cure ambient conditions.

FIG. 9 compares the FTIR spectrum for a wafer thermally cured in the presence of nitrogen and at a temperature of 425° C. for 1 hour with that of a wafer cured with an electron beam at a dose of 10000 $\mu C/cm^2$ and a temperature re of 200° C. and exposed to ambient moisture conditions for 7 days. The absence e of the absorbance increases at wavelengths of 3600–3700 ($cm^{-1}$) for the electron-beam cured wafers illustrates that they, in contrast to thermally-cured films, did not absorb moisture.

Figure 10A:
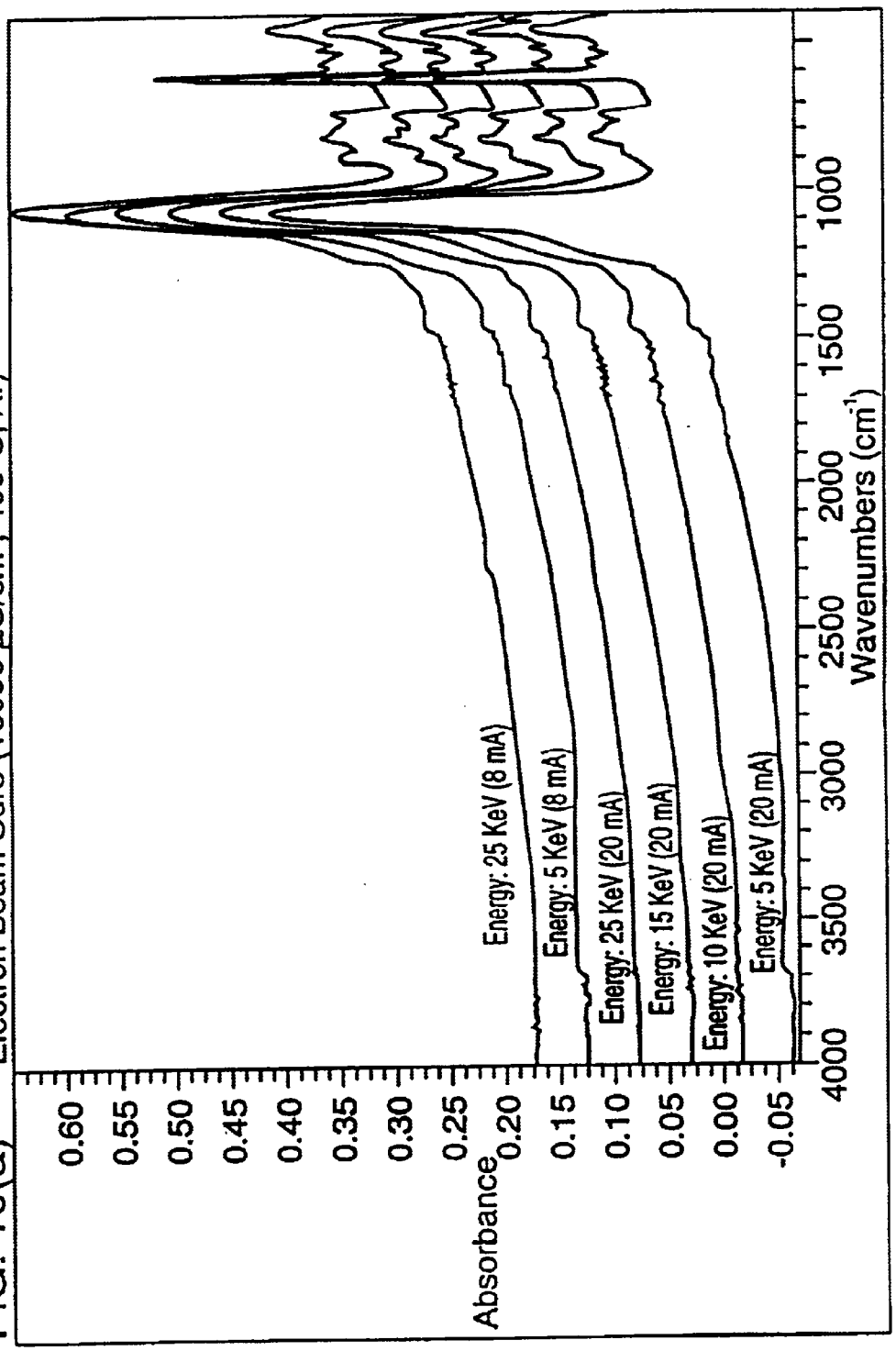
FIGS. 10 (a) and (b) are graphs of absorbance versus wavenumber ($cm^{-1}$) for the FTIR spectra of electron beam cured SOG coated wafers after electron-beam cure, as well as after electron beam cure followed by immersion in water, respectively.

FIGS. 10($a$) and ($b$) compare the FTIR spectra for films cured with electron beam radiation in the presence of argon gas at a dose of 10000 $\mu C/cm^2$ and at a temperature of 400° C., and at various energy levels both before and after a 24-hour immersion in water having a temperature of 25° C., respectively. The absence of a visible difference in the FTIR spectra before and after immersion in water indicates that the electron beam cured films did not absorb moisture when immersed in water for 24 hours.

Example 9

FTIR Results for Electron Beam Cured Films Under Nitrogen, Argon, Helium, and Oxygen Environments Wafers were produced and cured according to the processes set forth in Examples 1, 2 and 3, with the exception that the films were exposed to electron beam energy at a dose of 10000 $\mu C/cm^2$ and a temperature of 200° C. in the presence of Nitrogen, Argon, Helium, and Oxygen, respectively. After these wafers were aged by exposure to ambient moisture conditions for 7 days, FTIR analysis was performed.

Figure 11:
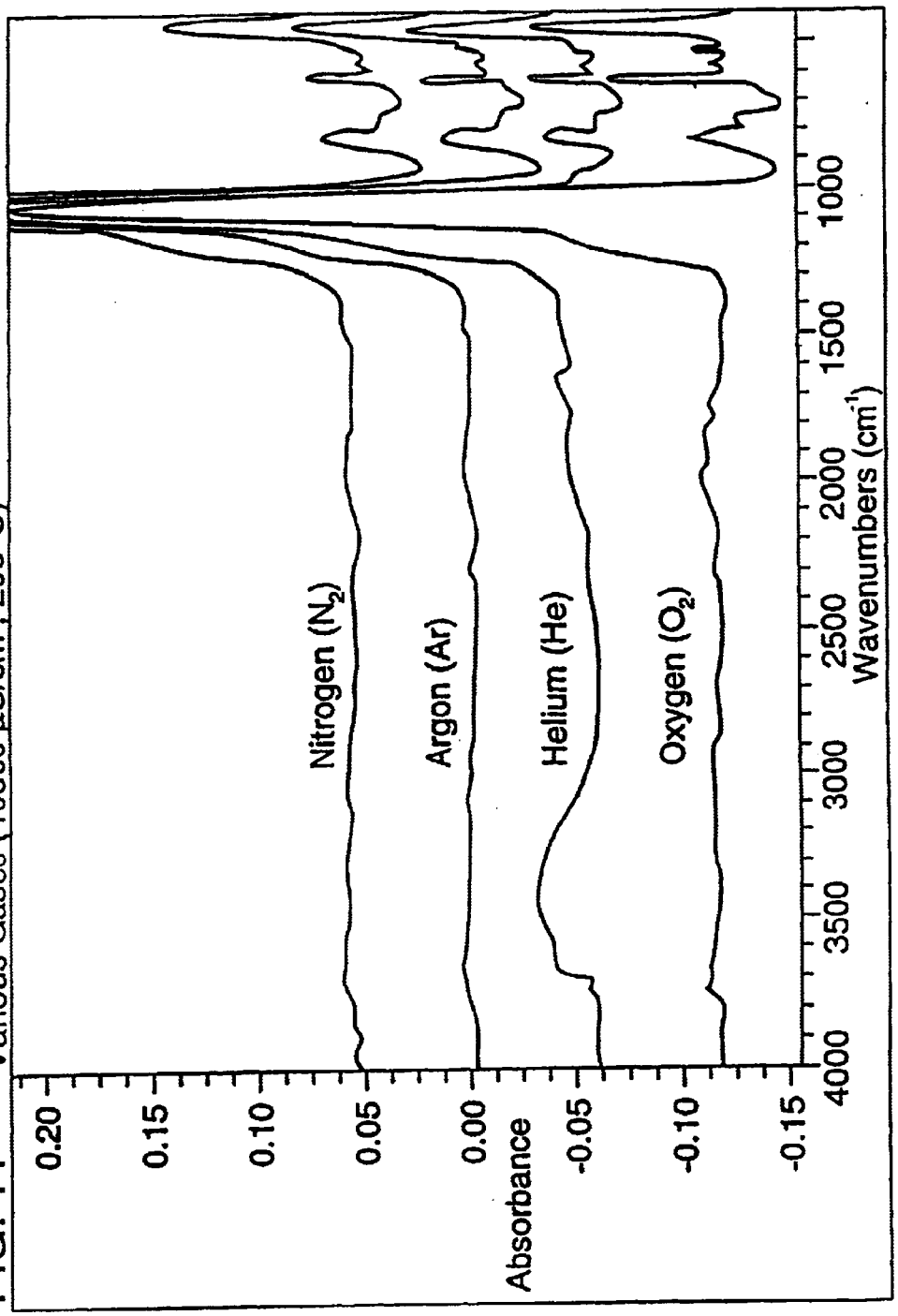
FIG. 11 is a graph of absorbance versus wavenumber ($cm^{-1}$) for the FTIR spectra for aged films cured with electron beams in the presence of various gases.

FIG. 11 illustrates a minimal increase in absorbance at wavelengths of 3600–3700 ($cm^{-1}$) for all gases except Helium. Thus, it is apparent that films may be cured in the presence of Nitrogen, Argon, and Oxygen without being susceptible to subsequent absorption of moisture.

Example 10

Chemical-MechanicalPolishing of Electron-Beam Cured Wafers

Wafers were produced and cured according to the processes set forth in Example 4, then polished and cleaned according to the processes set forth in Examples 7 and 13. During post-polish cleaning, contaminates were removed from film surfaces with a brief oxide etch in HF. This HF dip typically decorates the low density seams in plasma TEOS, requiring a cap deposition to smooth them over.

Thickness measurements of the CMP processed films demonstrated that the electron-beam cured siloxane material possessed a well-controlled polish rate which was similar to that of undoped TEOS, and did not exhibit any high etch rate areas in the post polish cleaned film.

Example 11

Disposable Post Device Wafers 0.5 $\mu$m CMOS SRAM disposable post process device wafers available from Cypress Semiconductor Inc. were coated twice according to the process set forth in Example 1, then cured at temperatures of either 150, 250, or 300° C. and a dose of 5000, 7500, and 10,000 $\mu$C/cm$^2$ according to the procedure set forth in Example 4. General details of disposable post processing are described in, for example, Cleeves, M., et al., IEEE Symposium on VLSI Technology Digest of Technical Papers, 61 (1994).

The thickness of the resulting "double coat" on the wafers was about 6500 Å. After polishing and processing the resulting wafers through an ash, followed by cleaning with HF as described in Examples 7 and 13, a Ti—TiW glue layer was deposited directly on the polished SOG surface of the wafers. Subsequently, the wafers were exposed to a 600° C. rapid thermal anneal ("RTA") for 1 minute prior to tungsten chemical vapor deposition ("CVD W") at 450° C. No lifting or outgassing of the film was observed in the resulting wafers.

The electron-beam cured "double coated" films also were baked for 30 minutes in a furnace set a temperature between 425° C. and 700° C. Film shrinkage analysis of films baked at a temperature of 425° C. indicated a 4% shrinkage in thickness based upon the thickness as measured directly after rapid thermal anneal. No additional shrinkage occurred at temperatures up to 700° C. Therefore, it is apparent from Example 11 that the amount of film shrinkage is independent of temperature. Moreover, the resulting wafers were crack-free and well-planarized.

Example 12

Etched Contact Device Wafers 0.5 $\mu$m CMOS SRAM conventional etched contact device wafers were produced, cured, polished, cleaned according to the procedure set forth in Example 11, with the exception that both single-coated and double-coated wafers were prepared. No lifting or outgassing of the films was observed during all the process steps required for the fabrication of these devices.

Example 13

Direct On Metal CMP Wafers

Two coats of Accuglass® 311 SOG were deposited directly on silicon wafers patterned with metal 1, i.e. aluminum, and cured with an electron beam according to the conditions as described in Example 4. 9,000 Å of TEOS was deposited in the manner of CVD onto the resulting SOG layer then polished using a Ipec Westech polishing machine equipped with an IC 1000/SUBA 4 polish pad available from Rodel under the following conditions: wafer pressure of 7 psi; polish temperature of wafer of 110° F.; SC 112 slurry available from Rippey flowing at 130 ml/min.; platen (holding pad) rpm of 28; carrier (holding wafer) rpm of 28; polish position of 185 mm; and platen oscillations of 5 mm at a speed of 2 mm/sec. Wafers were polished and cleaned with HF, followed by ashing with oxygen plasma. No adhesion problems or other undesirable interactions were seen between the SOG and TEOS layers.

In order to expose the interface between the SOG layer and the TEOS layer to polish stresses, the wafers produced in this Example were subsequently polished under similar conditions. No delamination or other anomaly was observed.

Example 14

Variable Number of SOG Lavers on Metal With Exposed Interface

Example 13 was repeated using either one, two, or three coats of SOG on the wafers. These wafers also showed excellent planarization without cracking of the SOG layer.

Example 15

TEOS-Capped, Variable Number of SOG Lavered Wafers

TEOS-capped wafers were produced and cured according to processes set forth in Examples 13 and 14, but with the exception of using about 12,000 Å of a doped TEOS oxide dielectric over the active devices, a dose of 5000 and 10000 $\mu$C/cm$^2$ and an energy of 9 and 15 KeV. The energy required for the electrons to reach the surface of the wafer was estimated to be about 12 KeV. The chosen values of electron beam energy were thus expected to put electrons beyond the TEOS film's surface and into the silicon wafer itself.

The cured wafers were then processed through the contact etch, contact fill (W plug) and local interconnect formation steps as set forth in Example 11, and tested for device and field threshold voltages and QBD of the gate oxide. The details of these tests are described in Wolf, "The Submicron MOSFET", 3 Silicon Processing for the VLSI Era (1995). The results of the field threshold test did not indicate a shift in the voltage ("Vts") of the n-channel transistors, but showed a small shift in the Vts of the p-channel transistors. However, the 30 mV shift of Vts of the p-channel devices at high energies of 15 KeV is still small in comparison to the permitted range for Vt variation, i.e. up to about 150 mV. An increase in the dose over 10000 $\mu$C/cm$^2$ with electron beam energy of 15000 KeV resulted in a.systematic degradation of the QBD, which implies that the gate oxide may become damaged during electron beam exposure at such high levels.

Example 16

Characteristics of SRAM Test Structure Incorporatino Film as a Dielectric Over Polysilicon A "double coat" of Accuglass® SOG film was produced and cured onto 0.5 $\mu$m polysilicon-coated Static Random Access Memory ("SRAM") test structures in accordance with the procedure set forth in Example 3 and under conditions of 200° C., 10 KeV, and 10000 $\mu$C/cm$^2$. 0.6 $\mu$m contacts were then made in the cured SOG coated structures by either the conventional etch based approach of Example 12 or the disposable post process of Example 11.

In the post processed structures, SOG characteristics were evaluated at different temperatures of anneal, i.e. 425° C., 600° C., and 700° C. before contact metallization but after formation of the contacts. The salicide resistance was unaffected by the SOG process because of the low thermal budget.

In order to form vias by conventional etch processes, the SOG layer was capped by 9000 Å of TEOS $SiO_2$ as described in Examples 13 and 14, then polished back according to the process set forth in Example 13. 0.7 vias were etched in this dielectric. Via filling was performed with blanket W and etchback processing as described in, for example, H. Kojima et al., "Planarization Process Using a Multi-Coating of Spin-On-Glass" VLSI, (June 1988).

Electrical resistance tests as described in, for example, Anner, "Planar Processing Primer"79–90 (1990), of the structures containing etch contacts showed that the contact resistance of the electron-beam cured SOG layer was higher than that for the doped reflowed TEOS $SiO_2$ dielectric layer. This is likely due to the large overetch in the contact etch which etched away most of the $TiSi_2$ from the underlying oxide.

As illustrated in FIG. 12, the QBD of the gate oxide is equivalent to that of doped reflowed TEOS $SiO_2$ with etched contacts, which implies that the damage to the oxide during electron-beam processing for wafers having a thin SOG layer is less than that for wafers having a TEOS $SiO_2$ oxide. A summary of the electrical results is provided in Table 2.

SOG selected and the thickness of the SOG coating is dependent upon the desired planarization. Optionally, the dielectric stack may be completed by a CVD TEOS oxide deposition if desired, or alternatively, the SOG may be left as the final layer in the inter-level dielectric stack.

Example 18

Formation of Ultra-Thin Gate Oxide

Polysilicon wafers are exposed to the electron beam processing conditions of Example 15 in the presence of oxygen gas under pressures of about 10 to about 200 mTorr and temperatures of about 250° C. for a period of time sufficient to grow the desired thickness of oxide. The result is a uniformly dense and homogeneous film which is suitable for further processing required for microelectronic applications.

What is claimed is:

1. A process for annealing a substrate coated with a chemical vapor deposit material comprising:
   a) applying to the surface of the substrate the chemical vapor deposit material; and
   b) exposing the chemical vapor deposit material to a wide, large beam of electron beam radiation from a substantially uniform large-area electron beam source, to expose the whole coated substrate simultaneously, under conditions sufficient to anneal the chemical vapor deposit material into a film.

2. The process of claim 1 wherein said chemical vapor deposit material is comprised of plasma-enhanced tetra-ethyl ortho silicate, silane based oxide, boron-

TABLE 2

| Contact scheme | Contact resistance (ohms) | | | | Self-aligned Contact Leakage | Salicide resistance | Salicide $P^+$-$N^+$ strap resistance |
| --- | --- | --- | --- | --- | --- | --- | --- |
| | Generic to $N^+$ | Generic to $P^+$ | Self-aligned ($P^+$) | Self-aligned ($N^+$) | | | |
| Post scheme with SOG (425 C Anneal) | 38 | 36 | 42 | 48 | Pass | 16 | 170 |
| Post scheme with SOG (600 C Anneal) | 39 | High | open | 61 | Pass | 19 | 270 |
| Post scheme with SOG (700 C Anneal) | 37 | 35 | 45 | 50 | Pass | 22 | 205 |
| Etch scheme with SOG | 32 | 31 | NA | NA | NA | 30 | 180 |
| Control | 25 | 25 | 68 | 58 | Pass | 135 | >5000 |

Example 17

Electron-Beam Processed CVD TEOS for Poly Level Dielectric

A layer of TEOS film having a thickness between 1000 Å to 8000 Å, preferably from about 1500 Å to about 3000 Å, is deposited via CVD onto polysilicon wafers under a temperature of about 350° C. to about 450° C. and a pressure of about 7 to 9 torr. The TEOS film is then exposed for about 10 minutes to a flux of electron-beam radiation at a dose of about 5000 to about 10000 $\mu C/cm^2$ and an energy of about 5 to about 15 KeV under a temperature of about 200° C. to about 250° C. and a pressure of about 10 mTorr to 40 mTorr in the presence of nitrogen or argon in an ElectronCure™ device available from Electron Vision, Inc. The resulting film is a silicon-rich, densified TEOS oxide.

Either silicate, phosphosilicate, and or siloxane SOG is then spun-on the cured TEOS wafers and cured. The type of phosphosilicate glass, phosphosilicate glass, nitride, anhydride film, oxynitride, borophospho glass from tetraethyl orthosilane, or mixtures thereof.

3. The process of claim 1 wherein said chemical vapor deposit material is a silane-based oxide.

4. The process of claim 1 wherein said chemical vapor deposit material is applied to said substrate in the presence of a gas comprising a mixture of tetra-ethyl ortho silicate and oxygen or oxygen, silane and optionally diborane, phosphine, and nitrous oxide.

5. The process of claim 1 wherein said film has a thickness of from about 500 Å to about 20000 Å.

6. The process of claim 1 wherein said chemical vapor deposit material is annealed at a temperature of from about 25° C. to about 400° C.

7. The process of claim 1 wherein said chemical vapor deposit material is annealed at a pressure of from about 10 mtorr to about 200 mtorr.

8. The process of claim 1 wherein said substrate is preheated to a temperature of from about 50° C. to about 250° C. before exposure to electron beam radiation.

9. The process of claim 1 wherein said substrate is exposed to electron beam radiation in the presence of a gas selected from the group consisting of oxygen, argon, nitrogen, helium and mixtures thereof.

10. A film produced according to the process of claim 1.

11. A substrate coated with at least one layer of the film of claim 10.

12. A microelectronic device containing the substrate of claim 10.

13. The process of claim 1 wherein the exposing is conducted with an electron beam which covers an area of from about 4 square inches to about 144 square inches.

14. The process of claim 1 wherein the exposing is conducted with an electron beam exposure for from about 2 minutes to about 45 minutes.

15. The process of claim 1 wherein the exposing is conducted with an electron beam dose of from about 1000 to about 50,000 $\mu C/cm^2$.

16. The process of claim 1 wherein the exposing is conducted with an electron beam at a age of from about 1 to about 25 KeV.

* * * * *